US012648198B2

(12) United States Patent
Yoo et al.

(10) Patent No.: US 12,648,198 B2
(45) Date of Patent: Jun. 2, 2026

(54) SEMICONDUCTOR DEVICE HAVING A SiGe BLOCKING LAYER AND METHOD OF FABRICATING THE SAME

(71) Applicant: SAMSUNG ELECTRONICS CO., LTD., Suwon-si (KR)

(72) Inventors: Hyumin Yoo, Suwon-si (KR); Myung Gil Kang, Suwon-si (KR); Dongwon Kim, Suwon-si (KR); Jongsu Kim, Suwon-si (KR); Beomjin Park, Suwon-si (KR); Byeonghee Son, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 407 days.

(21) Appl. No.: 18/385,537

(22) Filed: Oct. 31, 2023

(65) Prior Publication Data

US 2024/0355883 A1 Oct. 24, 2024

(30) Foreign Application Priority Data

Apr. 18, 2023 (KR) ........................ 10-2023-0050606

(51) Int. Cl.
H10D 62/13 (2025.01)
H10D 30/43 (2025.01)
(Continued)

(52) U.S. Cl.
CPC ........... H10D 62/149 (2025.01); H10D 30/43 (2025.01); H10D 30/6757 (2025.01);
(Continued)

(58) Field of Classification Search
CPC ................. H10D 30/01; H10D 30/014; H10D 30/019–0198; H10D 30/43; H10D 30/435; H10D 30/501–509; H10D 30/6735; H10D 30/674; H10D 30/6757; H10D 62/116; H10D 62/121; H10D 62/149; H10D 62/151; H10D 62/364; H10D 62/822; H10D 62/83; H10D 84/01; H10D 84/017; H10D 84/0193; H10D 84/038; H10D 84/8311; H10D 84/8312; H10D 84/83135; H10D 84/83138; H10D 84/8314; H10D 84/8316; H10D 84/836; H10D 84/837–839; H10D 84/85; H10D 84/851–852; H10D 84/853
See application file for complete search history.

(56) References Cited

U.S. PATENT DOCUMENTS 10,177,235 B2   1/2019   Balakrishnan et al.
10,211,307 B2   2/2019   Ching et al.
(Continued)

*Primary Examiner* — Cheung Lee
(74) *Attorney, Agent, or Firm* — Fish & Richardson P.C.

(57) ABSTRACT

A semiconductor device includes a substrate including an active pattern; a channel pattern on the active pattern, the channel pattern including a plurality of semiconductor patterns, which are stacked to be spaced apart from each other; a source/drain pattern connected to the plurality of semiconductor patterns; a gate electrode on the plurality of semiconductor patterns; and a blocking layer between the source/drain pattern and the active pattern, wherein the source/drain pattern includes a protruding side surface protruding toward the semiconductor patterns, the blocking layer includes silicon-germanium (SiGe), and a germanium concentration of the blocking layer is higher than a germanium concentration of the source/drain pattern.

20 Claims, 36 Drawing Sheets

(51) Int. Cl.

| | |
|---|---|
| *H10D 30/67* | (2025.01) |
| *H10D 84/01* | (2025.01) |
| *H10D 84/03* | (2025.01) |
| *H10D 84/85* | (2025.01) |
| *H10D 62/10* | (2025.01) |

(52) U.S. Cl.
CPC ......... *H10D 62/151* (2025.01); *H10D 84/017* (2025.01); *H10D 84/038* (2025.01); *H10D 84/85* (2025.01); *H10D 62/116* (2025.01)

(56) References Cited

U.S. PATENT DOCUMENTS

| | | | |
|---|---|---|---|
| 11,069,681 B2 | 7/2021 | Shin et al. |
| 11,404,274 B2 | 8/2022 | Chang et al. |
| 11,417,776 B2 | 8/2022 | Jung et al. |
| 11,489,078 B2 | 11/2022 | Lai et al. |
| 2022/0310806 A1 | 9/2022 | Yang |

SEMICONDUCTOR DEVICE HAVING A SiGe BLOCKING LAYER AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2023-0050606, filed on Apr. 18, 2023, in the Korean Intellectual Property Office, the entire contents of which are hereby incorporated by reference.

BACKGROUND

1. Field

Embodiments relate to a semiconductor device and a method of fabricating the same.

2. Description of the Related Art

A semiconductor device may include an integrated circuit composed of metal-oxide-semiconductor field-effect transistors (MOS-FETs). To meet an increasing demand for a semiconductor device with a small pattern size and a reduced design rule, the MOS-FETs are being aggressively scaled down.

SUMMARY

The embodiments may be realized by providing a semiconductor device including a substrate including an active pattern; a channel pattern on the active pattern, the channel pattern including a plurality of semiconductor patterns, which are stacked to be spaced apart from each other; a source/drain pattern connected to the plurality of semiconductor patterns; a gate electrode on the plurality of semiconductor patterns; and a blocking layer between the source/drain pattern and the active pattern, wherein the source/drain pattern includes a protruding side surface protruding toward the plurality of semiconductor patterns, the blocking layer includes silicon-germanium (SiGe), and a germanium concentration of the blocking layer is higher than a germanium concentration of the source/drain pattern.

The embodiments may be realized by providing a semiconductor device including a substrate including an active pattern; a first channel pattern and a second channel pattern on the active pattern, the first channel pattern including a first nanosheet and the second channel pattern including a second nanosheet; a source/drain pattern between the first channel pattern and the second channel pattern; a first gate electrode on the first channel pattern and a second gate electrode on the second channel pattern; and a blocking layer in contact with a bottom surface of the source/drain pattern, wherein the first gate electrode includes a first inner electrode on the first nanosheet, the second gate electrode includes a second inner electrode on the second nanosheet, the source/drain pattern includes a first portion between the first nanosheet and the second nanosheet; and a second portion between the first inner electrode and the second inner electrode, the first portion has a first width and the second portion has a second width, the first width is larger than the second width, the blocking layer includes silicon-germanium (SiGe), and a germanium concentration of the blocking layer is higher than a germanium concentration of the source/drain pattern.

The embodiments may be realized by providing a semiconductor device including a substrate including an NMOSFET region; an active pattern on the NMOSFET region; a channel pattern and a source/drain pattern on the active pattern, the channel pattern including a plurality of semiconductor patterns, which are stacked to be spaced apart from each other; a blocking layer between the source/drain pattern and the active pattern; a gate electrode on the channel pattern, the gate electrode including an inner electrode between adjacent semiconductor patterns of the plurality of semiconductor patterns; a gate insulating layer between the gate electrode and the channel pattern; an inner spacer between the inner electrode and the source/drain pattern; a gate spacer on a side surface of the gate electrode; a gate capping pattern on a top surface of the gate electrode; a gate cutting pattern penetrating the gate electrode; an interlayer insulating layer on the gate capping pattern and the gate cutting pattern; an active contact penetrating the interlayer insulating layer and being electrically connected to the source/drain pattern; a metal-semiconductor compound layer between the active contact and the source/drain pattern; a gate contact penetrating the interlayer insulating layer and the gate capping pattern and being electrically connected to the gate electrode; and a first metal layer on the interlayer insulating layer, wherein the first metal layer includes a power line, which is vertically overlapped with the gate cutting pattern, and first interconnection lines, which are electrically and respectively connected to the active contact and the gate contact, the blocking layer includes silicon-germanium (SiGe), and the blocking layer covers at least a portion of a side surface of the inner spacer.

BRIEF DESCRIPTION OF THE DRAWINGS

Features will be apparent to those of skill in the art by describing in detail exemplary embodiments with reference to the attached drawings in which.

DETAILED DESCRIPTION

Example embodiments will now be described more fully with reference to the accompanying drawings, in which example embodiments are shown.

Figure 1:
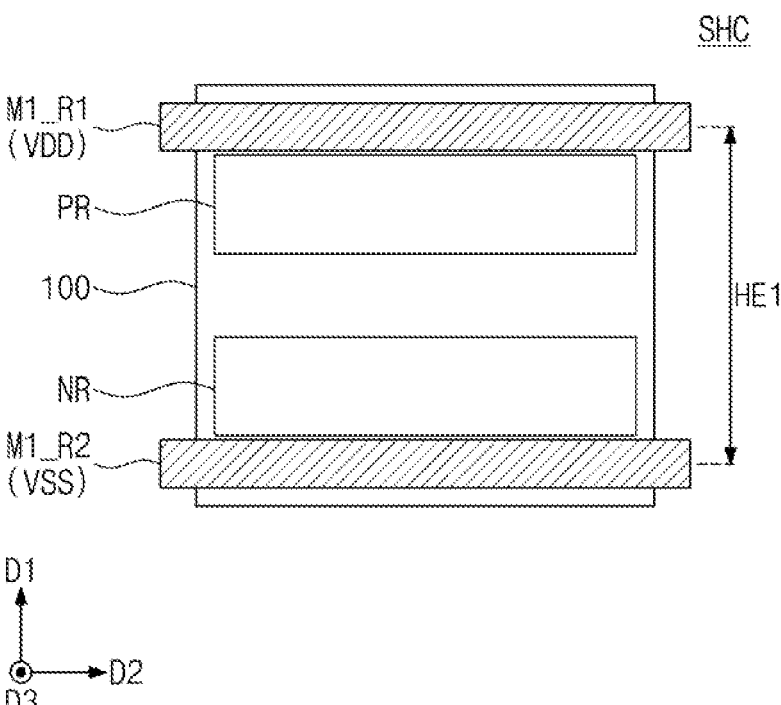
FIGS. 1 to 3 are conceptual diagrams illustrating logic cells of a semiconductor device, according to an embodiment.
Figure 2:
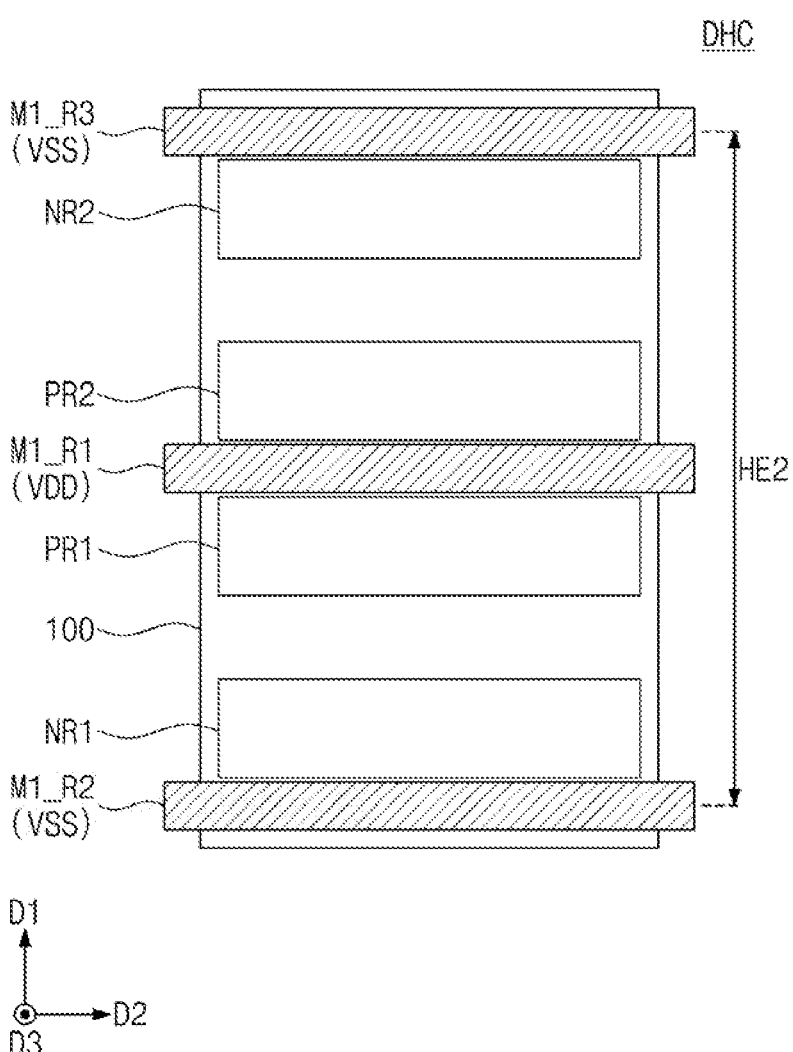
Figure 3:
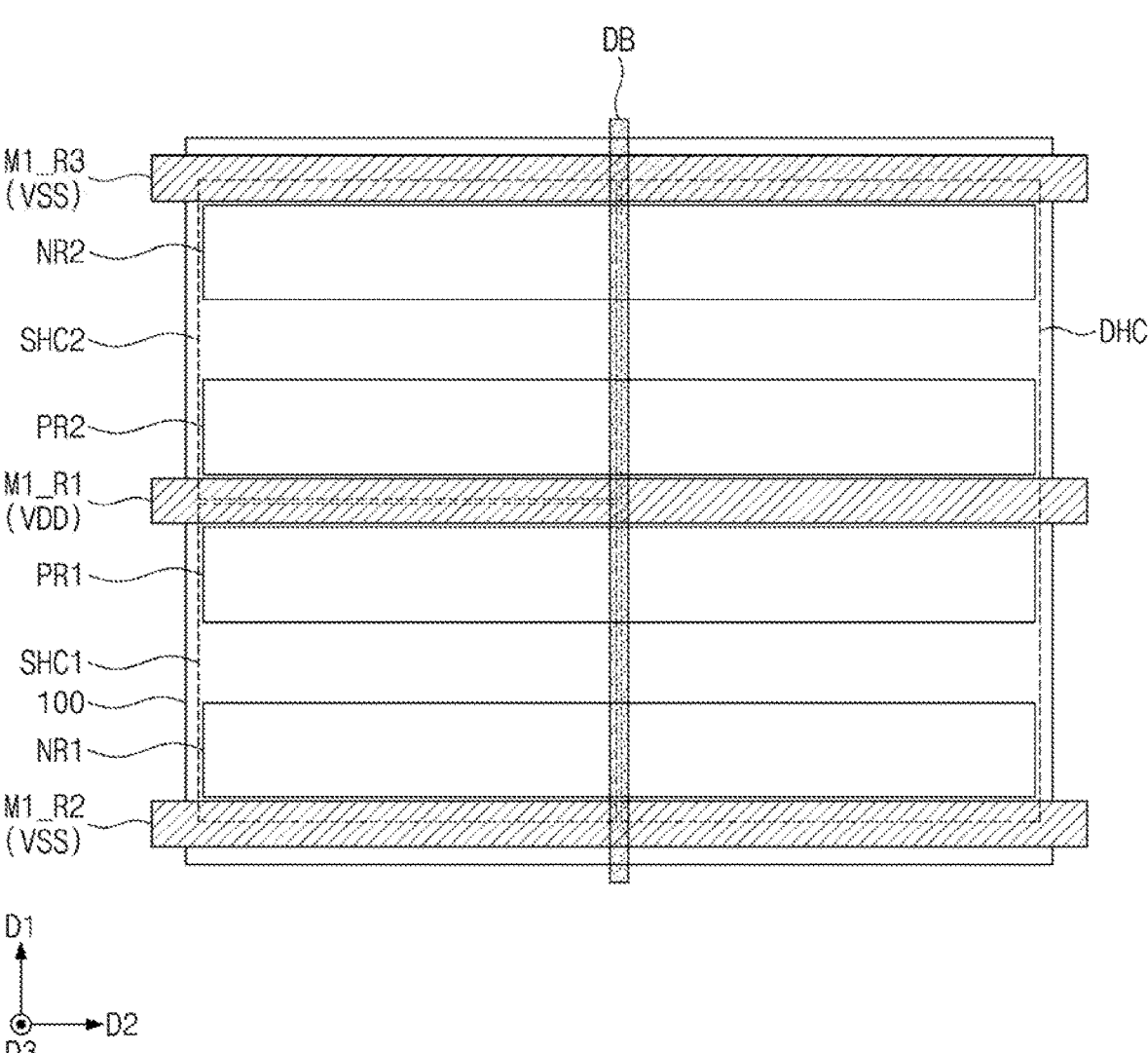

FIGS. 1 to 3 are conceptual diagrams illustrating logic cells of a semiconductor device, according to an embodiment.

Referring to FIG. 1, a single height cell SHC may be provided. In an implementation, a first power line M1_R1 and a second power line M1_R2 may be provided on a substrate 100. The first power line M1_R1 may be a conduction path, to which a source voltage (VSS) (e.g., a ground voltage) may be provided. The second power line M1_R2 may be a conduction path, to which a drain voltage (VDD) (e.g., a power voltage) may be provided.

The single height cell SHC may be defined between the first power line M1_R1 and the second power line M1_R2. The single height cell SHC may include a PMOSFET region PR1 and an NMOSFET region NR1. In an implementation, the single height cell SHC may have a CMOS structure provided between the first and second power lines M1_R1 and M1_R2.

Each of the PMOSFET region PR1 and NMOSFET region NR1 may have a first width in a first direction D1. A length of the single height cell SHC in the first direction D1 may be defined as a first height HE1. The first height HE1 may be substantially equal to a distance (e.g., a pitch) between the first and second power lines M1_R1 and M1_R2.

The single height cell SHC may constitute a single logic cell. In an implementation, the logic cell may mean a logic device (e.g., AND, OR, XOR, XNOR, inverter, and so forth), which is configured to execute a specific function. In an implementation, the logic cell may include transistors constituting the logic device and interconnection lines connecting transistors to each other.

Referring to FIG. 2, a double height cell DHC may be provided. In an implementation, a first power line M1_R1, a second power line M1_R2, and a third power line M1_R3 may be provided on the substrate 100. The first power line M1_R1 may be between the second power line M1_R2 and the third power line M1_R3. The third power line M1_R3 may be a conduction path, to which the source voltage (VSS) may be provided.

The double height cell DHC may be defined between the second power line M1_R2 and the third power line M1_R3. The double height cell DHC may include a pair of PMOSFET regions PR1 and PR2 and a pair of NMOSFET regions NR1 and NR2.

One of the NMOSFET regions NR1 may be adjacent to the second power line M1_R2. The other of the NMOSFET regions NR2 may be adjacent to the third power line M1_R3. The pair of the PMOSFET regions PR1 and PR2 may be adjacent to the first power line M1_R1. When viewed in a plan view, the first power line M1_R1 may be between the pair of the PMOSFET regions PR1 and PR2.

A length of the double height cell DHC in the first direction D1 may be defined as a second height HE2. The second height HE2 may be about two times the first height HE1 of FIG. 1. The pair of the PMOSFET regions PR1 and PR2 of the double height cell DHC may be combined to serve as a single active region.

In an implementation, the double height cell DHC shown in FIG. 2 may be defined as a multi-height cell. In an implementation, the multi-height cell may include a triple height cell whose cell height is about three times that of the single height cell SHC.

Referring to FIG. 3, a first single height cell SHC1, a second single height cell SHC2, and a double height cell DHC may be two-dimensionally arranged on the substrate 100. The first single height cell SHC1 may be between the first and second power lines M1_R1 and M1_R2. The second single height cell SHC2 may be between the first and third power lines M1_R1 and M1_R3. The second single height cell SHC2 may be adjacent to the first single height cell SHC1 in the first direction D1.

The double height cell DHC may be between the second and third power lines M1_R2 and M1_R3. The double height cell DHC may be adjacent to the first and second single height cells SHC1 and SHC2 in a second direction D2.

A division structure DB may be between the first single height cell SHC1 and the double height cell DHC and between the second single height cell SHC2 and the double height cell DHC. The active region of the double height cell DHC may be electrically separated from the active region of each of the first and second single height cells SHC1 and SHC2 by the division structure DB.

Figure 4:
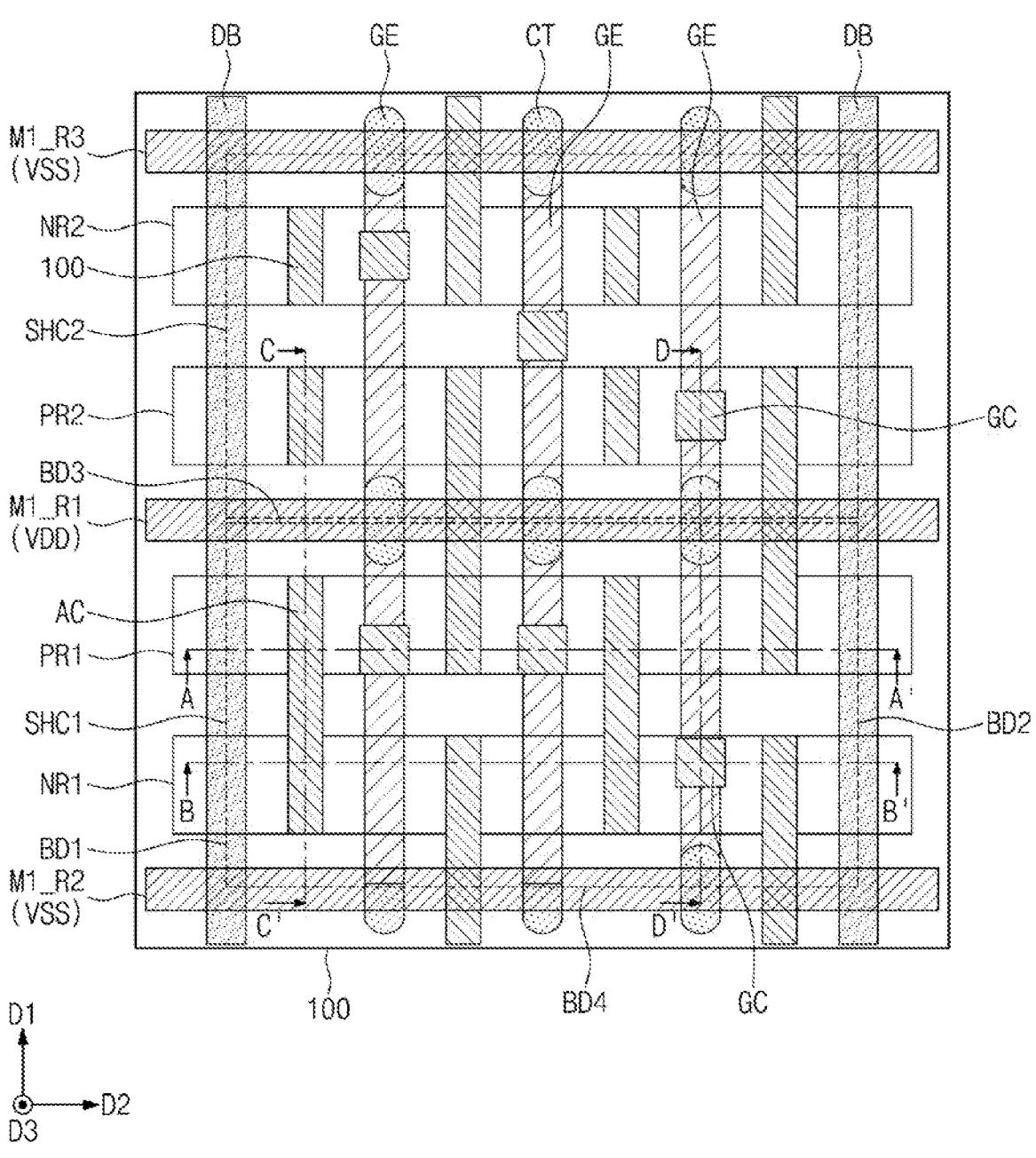
FIG. 4 is a plan view illustrating a semiconductor device according to an embodiment.
Figure 5A:
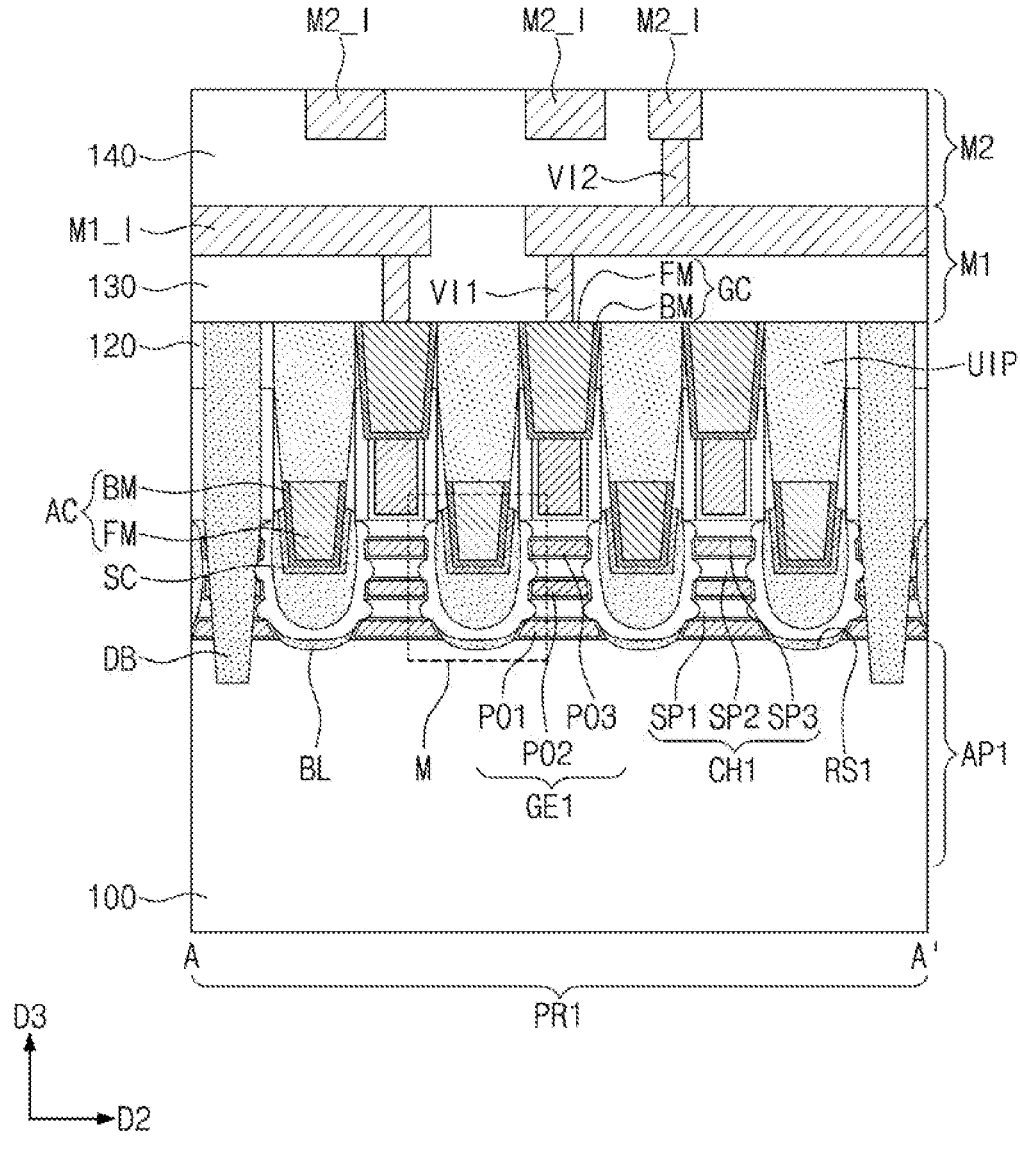
FIGS. 5A to 5D are sectional views which are taken along lines A-A', B-B', C-C', and D-D' of FIG. 4, respectively.
Figure 5B:
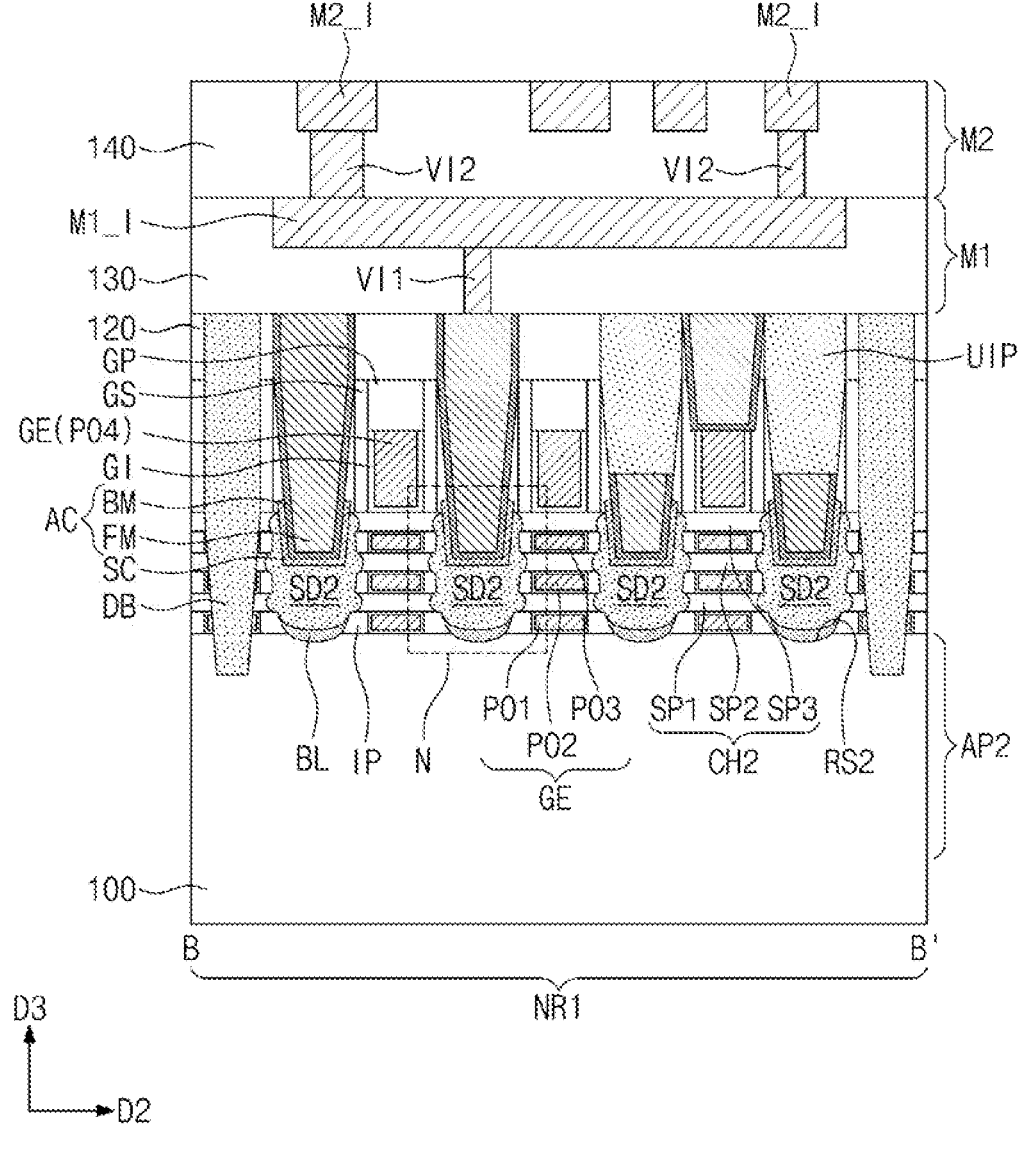
Figure 5C:
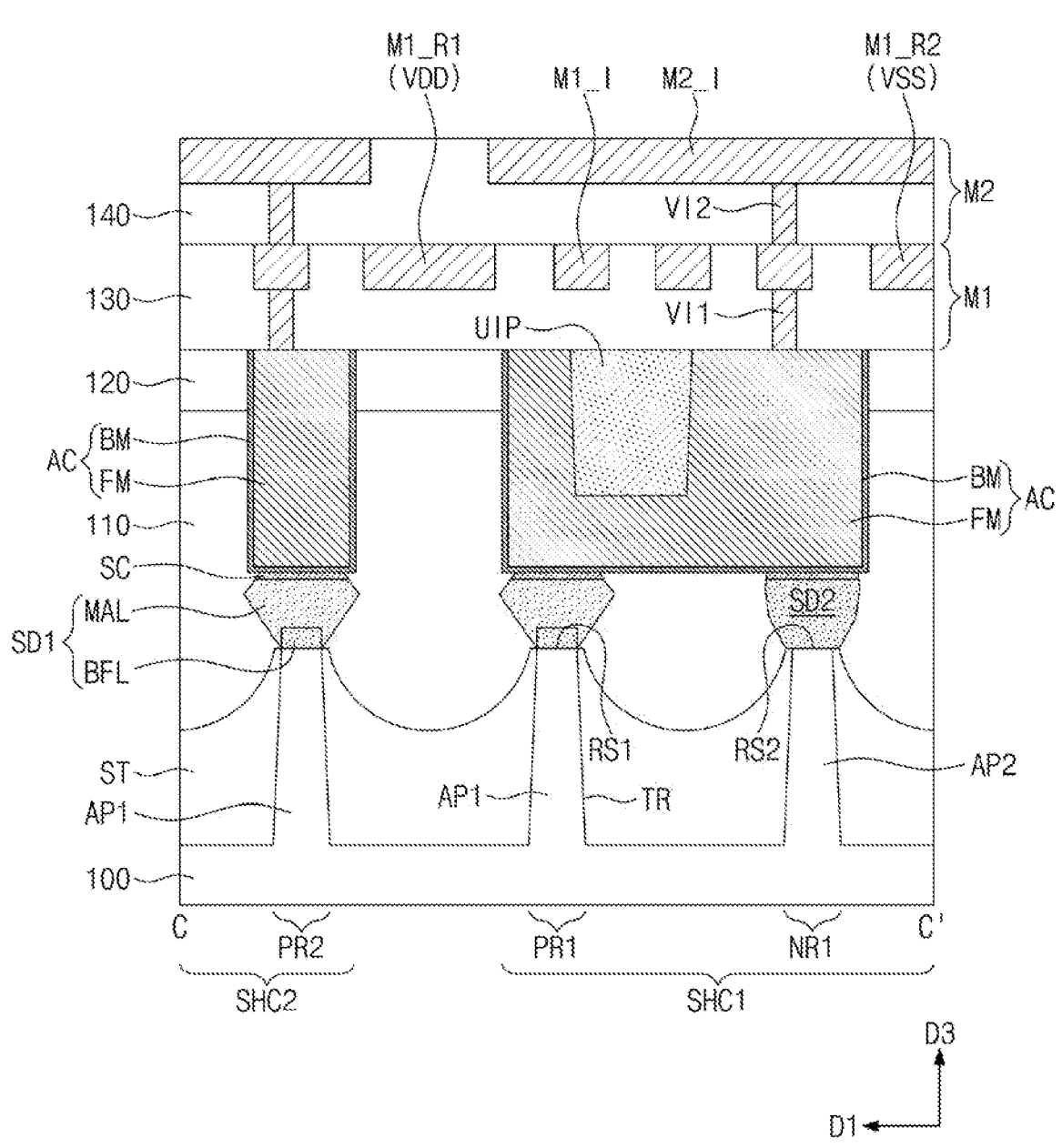
Figure 6:
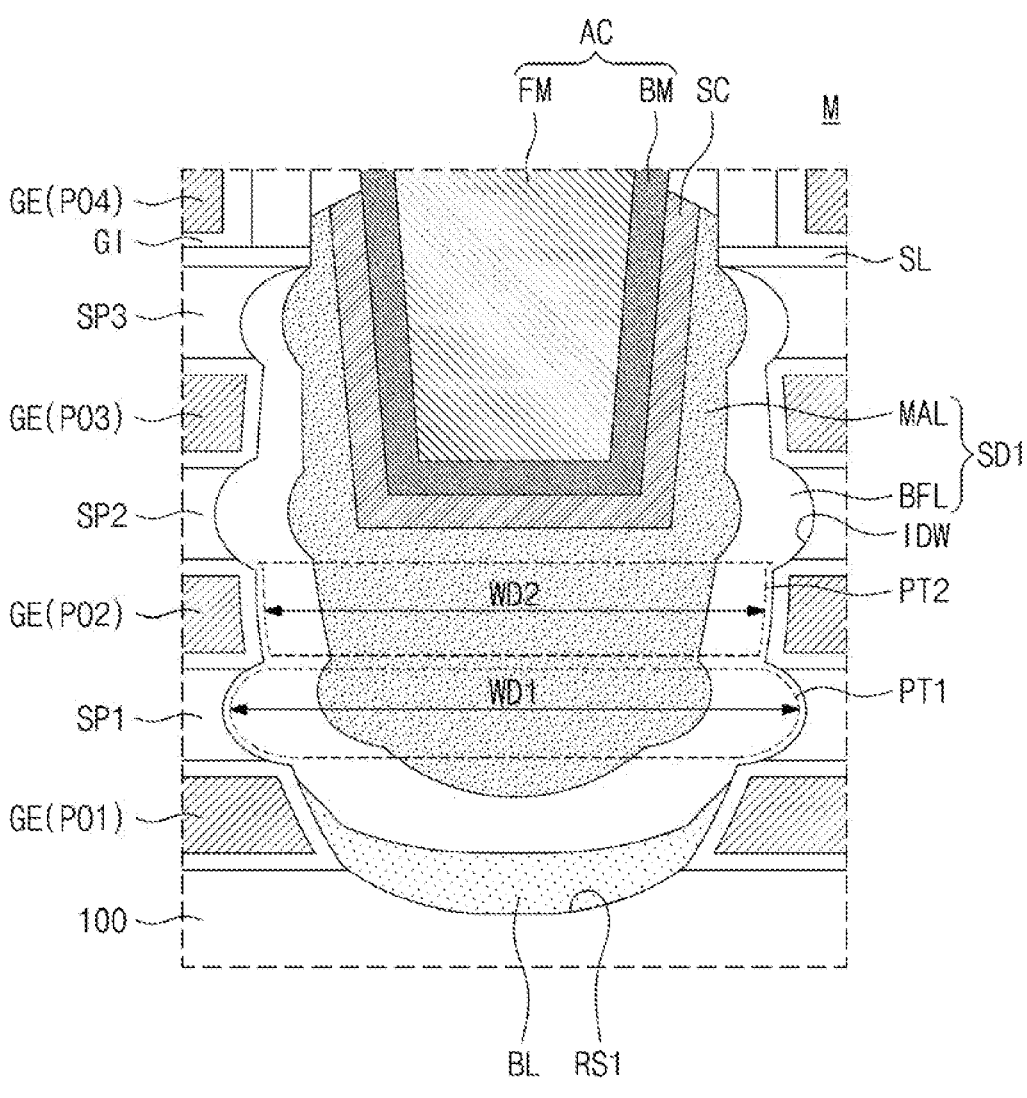
FIG. 6 is an enlarged sectional view illustrating a portion 'M' of FIG. 5A.
Figure 7:
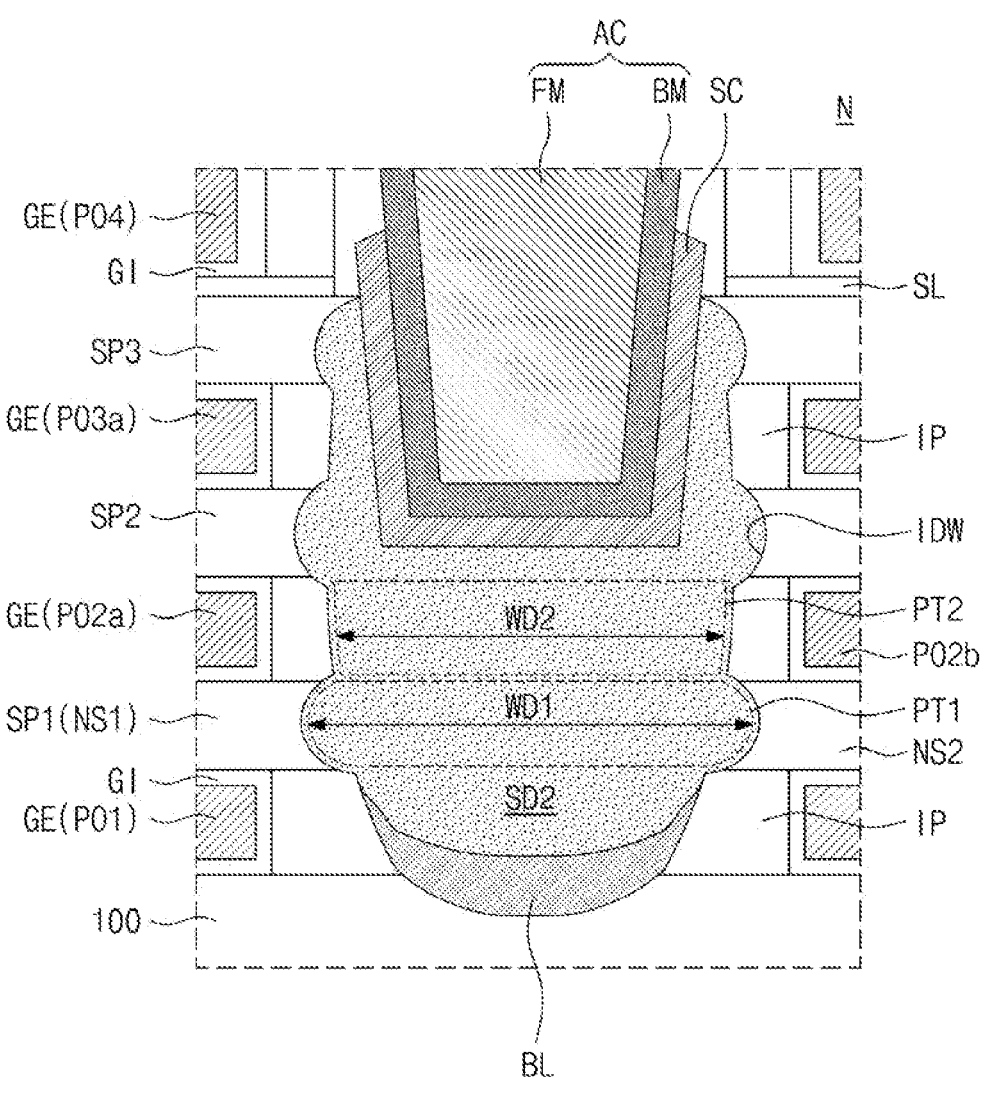
FIG. 7 is an enlarged sectional view illustrating a portion 'N' of FIG. 5B.

FIG. 4 is a plan view illustrating a semiconductor device according to an embodiment. FIGS. 5A to 5D are sectional views which are taken along lines A-A', B-B', C-C', and D-D' of FIG. 4, respectively. FIG. 6 is an enlarged sectional view illustrating a portion 'M' of FIG. 5A. FIG. 7 is an enlarged sectional view illustrating a portion 'N' of FIG. 5B. The semiconductor device of FIGS. 4 and 5A to 5D may be a concrete example of the single height cell SHC of FIG. 1.

Referring to FIGS. 4 and 5A to 5D, the single height cell SHC may be on the substrate 100. Logic transistors constituting a logic circuit may be on the single height cell SHC. The substrate 100 may be a semiconductor substrate that is formed of or includes, e.g., silicon, germanium, silicon germanium, a compound semiconductor material, or the like. In an implementation, the substrate 100 may be a silicon wafer. As used herein, the term "or" is not necessarily an exclusive term, e.g., "A or B" would include A, B, or A and B.

The substrate 100 may include the first active region AR1 and the second active region AR2. Each of the first and second active regions AR1 and AR2 may extend (e.g., lengthwise) in the second direction D2. In an implementation, the first active region AR1 may be a PMOSFET region, and the second active region AR2 may be an NMOSFET region.

A first active pattern AP1 and a second active pattern AP2 may be defined by a trench TR, which may be in an upper portion of the substrate 100. The first active pattern AP1 may be on the first active region AR1, and the second active pattern AP2 may be on the second active region AR2. The first and second active patterns AP1 and AP2 may extend in the second direction D2. Each of the first and second active patterns AP1 and AP2 may be a vertically-protruding portion of the substrate 100.

A device isolation layer ST may be on the substrate 100. The device isolation layer ST may fill the trench TR. The device isolation layer ST may include a silicon oxide layer. The device isolation layer ST may not cover first and second channel patterns CH1 and CH2 to be described below.

A first channel pattern CH1 may be on the first active pattern AP1. A second channel pattern CH2 may be on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3).

Each of the first and second channel pattern CH1 and CH2 may include the third semiconductor pattern SP3 at the highest level thereof. A sacrificial layer SL may be on a top surface of the third semiconductor pattern SP3 (e.g., see FIGS. 6 and 7). The sacrificial layer SL may cover at least a portion of the top surface of the third semiconductor pattern SP3. The sacrificial layer SL may protect the third semiconductor pattern SP3 in a fabrication process to be described below. As used herein, the terms "first," "second,"

and the like are merely for identification and differentiation, and are not intended to imply or require sequential inclusion (e.g., a third element and a fourth element may be described without implying or requiring the presence of a first element or second element).

Each of the first to third semiconductor patterns SP1, SP2, and SP3 may be formed of or include, e.g., silicon (Si), germanium (Ge), or silicon germanium (SiGe). In an implementation, each of the first to third semiconductor patterns SP1, SP2, and SP3 may be formed of or include, e.g., crystalline silicon.

A plurality of first source/drain patterns SD1 may be on the first active pattern AP1. A plurality of first recesses RS1 may be in an upper portion of the first active pattern AP1. The first source/drain patterns SD1 may be in the first recesses RS1, respectively. The first source/drain patterns SD1 may be impurity regions of a first conductivity type (e.g., n-type). The first channel pattern CH1 may be between each pair of the first source/drain patterns SD1. In an implementation, each pair of the first source/drain patterns SD1 may be connected to each other by the stacked first to third semiconductor patterns SP1, SP2, and SP3.

A plurality of second source/drain patterns SD2 may be on the second active pattern AP2. A plurality of second recesses RS2 may be in an upper portion of the second active pattern AP2. The second source/drain patterns SD2 may be in the second recesses RS2, respectively. The second source/drain patterns SD2 may be impurity regions of a second conductivity type (e.g., p-type). The second channel pattern CH2 may be between each pair of the second source/drain patterns SD2. In an implementation, each pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth (SEG) process. In an implementation, each of the first and second source/drain patterns SD1 and SD2 may have a top surface that is higher (e.g., farther from the substrate 100 in the third direction D3) than a top surface of the third semiconductor pattern SP3. In an implementation, a top surface of at least one of the first and second source/drain patterns SD1 and SD2 may be at substantially the same level as the top surface of the third semiconductor pattern SP3.

In an implementation, the first source/drain patterns SD1 may be formed of or include, e.g., a semiconductor material whose lattice constant is greater than that of the substrate 100. In an implementation, the first source/drain patterns SD1 may be formed of or include, e.g., silicon (Si) or silicon-germanium (SiGe). In an implementation, each pair of the first source/drain patterns SD1 may exert a compressive stress on the first channel pattern CH1 therebetween. The second source/drain patterns SD2 may be formed of or include the same semiconductor material as the substrate 100. In an implementation, the second source/drain patterns SD2 may be formed of or include, e.g., silicon-arsenic (SiAs) or silicon-phosphorus (SiP).

A side surface of each of the first and second source/drain patterns SD1 and SD2 may have an uneven, undulating, or embossed shape. In an implementation, the side surface of each of the first and second source/drain patterns SD1 and SD2 may have a wavy profile. In an implementation, the side surface of the first source/drain pattern SD1 may protrude (e.g., outwardly) toward the first to third semiconductor patterns SP1, SP2, and SP3 of the first channel pattern CH1. The side surface of the second source/drain pattern SD2 may protrude toward the first to third semiconductor patterns SP1, SP2, and SP3 of the second channel pattern CH2.

Gate electrodes GE may cross the first and second channel patterns CH1 and CH2 and extend in the first direction D1. The gate electrodes GE may be arranged at a first pitch in the second direction D2. Each of the gate electrodes GE may be vertically overlapped with the first and second channel patterns CH1 and CH2.

The gate electrode GE may include a first portion PO1 between the active pattern AP1 or AP2 and the first semiconductor pattern SP1, a second portion PO2 between the first semiconductor pattern SP1 and the second semiconductor pattern SP2, a third portion PO3 between the second semiconductor pattern SP2 and the third semiconductor pattern SP3, and a fourth portion PO4 on the third semiconductor pattern SP3.

Figure 5D:
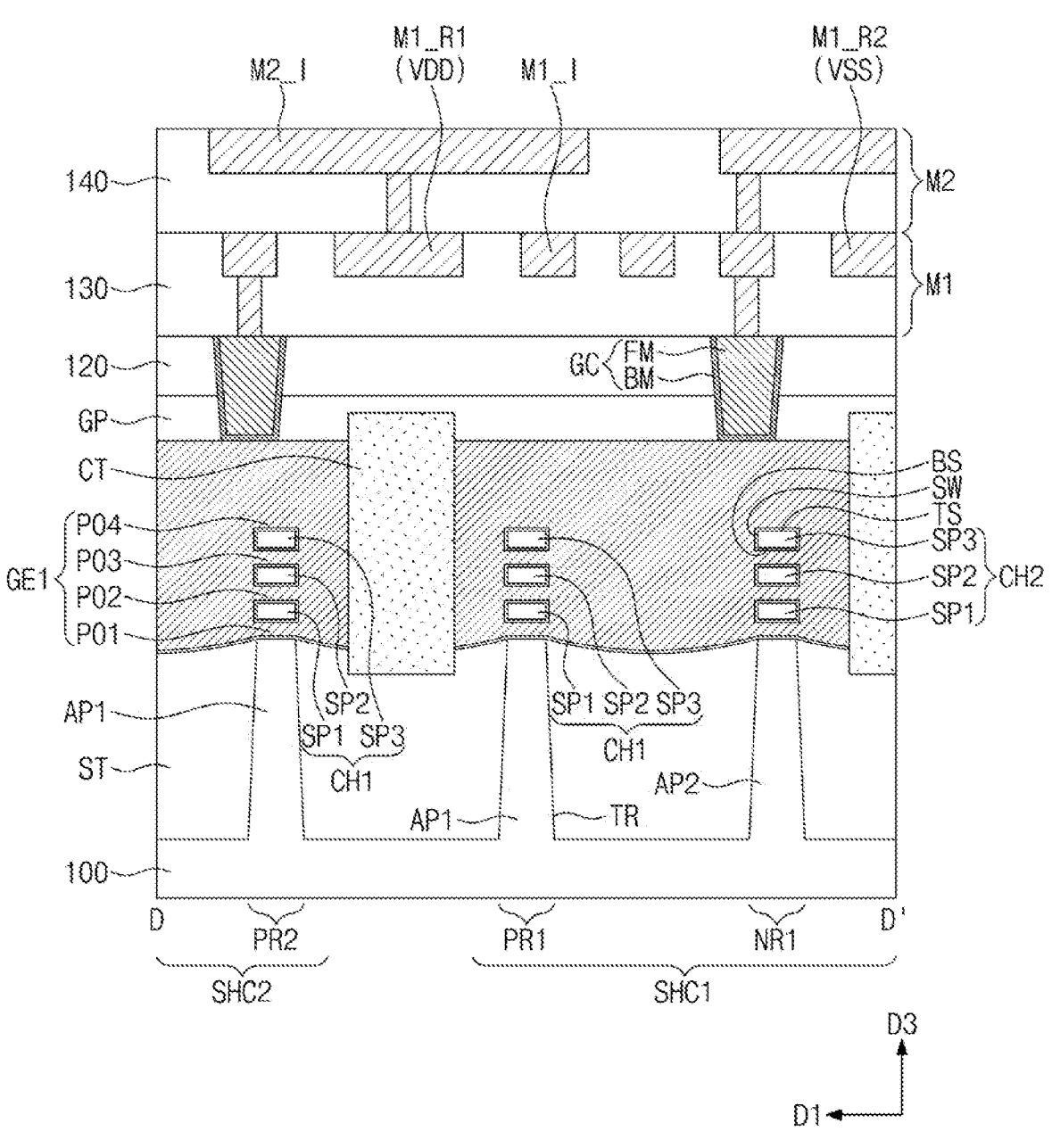

Referring to FIG. 5D, the gate electrode GE may be on a top surface TS, a bottom surface BS, and opposite side surfaces SW of each of the first to third semiconductor patterns SP1, SP2, and SP3. In an implementation, the transistor according to the present embodiment may be a three-dimensional field effect transistor (e.g., MBCFET or GAAFET) in which the gate electrode GE is provided to three-dimensionally surround the channel pattern.

Inner spacers IP may be respectively between the first to third portions PO1, PO2, and PO3 of the gate electrode GE and the second source/drain pattern SD2. Each of the first to third portions PO1, PO2, and PO3 of the gate electrode GE may be spaced apart from the second source/drain pattern SD2 with the inner spacer IP therebetween. The inner spacer IP may help prevent a leakage current from the gate electrode GE. In an implementation, the inner spacer IP may be formed of or include, e.g., silicon oxide, silicon oxynitride, or silicon nitride.

Referring back to FIGS. 4 and 5A to 5D, a pair of gate spacers GS may be respectively on opposite side surfaces of the fourth portion PO4 of the gate electrode GE. The gate spacers GS may extend along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. In an implementation, the gate spacers GS may be formed of or include, e.g., SiCN, SiCON, or SiN. In an implementation, the gate spacers GS may be a multi-layered structure, which may be formed of or include at least two different materials selected from SiCN, SiCON, and SiN.

A gate capping pattern GP may be on the gate electrode GE. The gate capping pattern GP may extend along the gate electrode GE or in the first direction D1. The gate capping pattern GP may be formed of or include a material having an etch selectivity with respect to first and second interlayer insulating layers 110 and 120, which will be described below. In an implementation, the gate capping pattern GP may be formed of or include, e.g., SiON, SiCN, SiCON, or SiN.

A gate insulating layer GI may be between the gate electrode GE and the first channel pattern CH1 and between the gate electrode GE and the second channel pattern CH2. The gate insulating layer GI may cover the top surface TS, the bottom surface BS, and the opposite side surfaces SW of each of the first to third semiconductor patterns SP1, SP2, and SP3. The gate insulating layer GI may cover a top surface of the device isolation layer ST below the gate electrode GE.

In an implementation, the gate insulating layer GI may include, e.g., a silicon oxide layer, a silicon oxynitride layer, or a high-k dielectric layer. The high-k dielectric layer may be formed of or include a high-k dielectric material whose dielectric constants are higher than that of silicon oxide. In an implementation, the high-k dielectric material may include, e.g., hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate electrode GE may include a first electrode pattern and a second electrode pattern on the first electrode pattern. The first electrode pattern may be on the gate insulating layer GI and may be adjacent to the first to third semiconductor patterns SP1, SP2, and SP3. The first electrode pattern may include a work-function metal, which may be used to adjust a threshold voltage of the transistor. By adjusting a thickness and composition of the first electrode pattern, it may be possible to realize a transistor having a desired threshold voltage. In an implementation, the first to third inner electrodes PO1, PO2, and PO3 of the gate electrode GE may be composed of the first electrode pattern or the work-function metal.

The first electrode pattern may be formed of or include, e.g., metal nitride materials. In an implementation, the first electrode pattern may include a layer that is composed of nitrogen (N) and a metallic material, e.g., titanium (Ti), tantalum (Ta), aluminum (Al), tungsten (W), or molybdenum (Mo). In an implementation, the first electrode pattern may further include carbon (C). The first electrode pattern may include a plurality of work function metal layers which are stacked.

The second electrode pattern may be formed of or include a metallic material whose resistance is lower than the first electrode pattern. In an implementation, the second electrode pattern may be formed of or include a metallic material, e.g., tungsten (W), aluminum (Al), titanium (Ti), or tantalum (Ta). The fourth outer electrode PO4 of the gate electrode GE may include the first electrode pattern and the second electrode pattern on the first electrode pattern.

A first interlayer insulating layer 110 may be on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be on the first interlayer insulating layer 110 and cover the gate capping pattern GP. A third interlayer insulating layer 130 may be on the second interlayer insulating layer 120. A fourth interlayer insulating layer 140 may be on the third interlayer insulating layer 130. In an implementation, at least one of the first to fourth interlayer insulating layers 110, 120, 130, and 140 may include a silicon oxide layer.

The single height cell SHC may have a first border BD1 and a second border BD2, which are opposite to each other in the second direction D2. The first and second borders BD1 and BD2 may extend in the first direction D1. The single height cell SHC may have a third border BD3 and a fourth border BD4, which are opposite to each other in the first direction D1. The third and fourth borders BD3 and BD4 may be extended in the second direction D2.

A pair of division structures DB, which are opposite to each other in the second direction D2, may be at both sides of the single height cell SHC. In an implementation, the pair of the division structures DB may be respectively on the first and second borders BD1 and BD2 of the single height cell SHC. The division structure DB may extend in the first direction D1 to be parallel to the gate electrodes GE. A pitch between the division structure DB and the gate electrode GE adjacent thereto may be equal to the first pitch.

The division structure DB may penetrate the first and second interlayer insulating layers 110 and 120 and may extend into the first and second active patterns AP1 and AP2. The division structure DB may penetrate an upper portion of each of the first and second active patterns AP1 and AP2. The division structure DB may electrically separate an active region of each of the single height cell SHC from an active region of a neighboring cell.

Active contacts AC may penetrate the first and second interlayer insulating layers 110 and 120 and to be electrically connected to the first and second source/drain patterns SD1 and SD2, respectively. A pair of the active contacts AC may be respectively at both sides of the gate electrode GE. When viewed in a plan view, the active contact AC may be a bar-shaped pattern that is extended in the first direction D1.

The active contact AC may be a self-aligned contact. In an implementation, the active contact AC may be formed by a self-alignment process using the gate capping pattern GP and the gate spacer GS. In an implementation, the active contact AC may cover at least a portion of the side surface of the gate spacer GS. In an implementation, the active contact AC may cover a portion of the top surface of the gate capping pattern GP.

Metal-semiconductor compound layers SC (e.g., silicide layers) may be respectively between the active contact AC and the first source/drain pattern SD1 and between the active contact AC and the second source/drain pattern SD2. The active contact AC may be electrically connected to the source/drain pattern SD1 or SD2 through the metal-semiconductor compound layer SC. In an implementation, the metal-semiconductor compound layer SC may be formed of or include, e.g., titanium silicide, tantalum silicide, tungsten silicide, nickel silicide, or cobalt silicide.

Gate contacts GC may penetrate the second interlayer insulating layer 120 and the gate capping pattern GP and may be electrically connected to the gate electrodes GE, respectively. When viewed in a plan view, the gate contacts GC may be respectively overlapped with the first and second active regions AR1 and AR2. In an implementation, the gate contact GC may be on the second active pattern AP2 (e.g., see FIG. 5B).

In an implementation, referring to FIG. 5B, an upper portion of the active contact AC adjacent to the gate contact GC may be filled with an upper insulating pattern UIP. A bottom surface of the upper insulating pattern UIP may be lower than a bottom surface of the gate contact GC. In other words, a top surface of the active contact AC adjacent to the gate contact GC may be at a level, which is lower than the bottom surface of the gate contact GC, by the upper insulating pattern UIP. Accordingly, it may be possible to prevent the gate contact GC and the active contact AC, which are adjacent to each other, from being in contact with each other and thereby to prevent a short circuit issue from occurring therebetween.

Each of the active and gate contacts AC and GC may include a conductive pattern FM and a barrier pattern BM enclosing the conductive pattern FM. In an implementation, the conductive pattern FM may be formed of or include a metallic material (e.g., aluminum, copper, tungsten, molybdenum, or cobalt). The barrier pattern BM may cover side and bottom surfaces of the conductive pattern FM. In an implementation, the barrier pattern BM may include a metal layer and a metal nitride layer. The metal layer may be formed of or include, e.g., titanium, tantalum, tungsten, nickel, cobalt, or platinum. The metal nitride layer may be formed of or include, e.g., titanium nitride (TiN), tantalum nitride (TaN), tungsten nitride (WN), nickel nitride (NiN), cobalt nitride (CON), or platinum nitride (PtN).

A first metal layer M1 may be in the third interlayer insulating layer 130. In an implementation, the first metal layer M1 may include the first power line M1_R1, the second power line M1_R2, and first interconnection lines M1_I. Each of the interconnection lines M1_R1, M1_R2, and M1_I of the first metal layer M1 may extend in the second direction D2 and parallel to each other.

In an implementation, the first and second power lines M1_R1 and M1_R2 may be respectively on the third and fourth borders BD3 and BD4 of the single height cell SHC. The first power line M1_R1 may extend along the third border BD3 and in the second direction D2. The second power line M1_R2 may extend along the fourth border BD4 and in the second direction D2.

The first interconnection lines M1_I of the first metal layer M1 may be between the first and second power lines M1_R1 and M1_R2. The first interconnection lines M1_I of the first metal layer M1 may be arranged at a second pitch in the first direction D1. The second pitch may be smaller than the first pitch. A linewidth of each of the first interconnection lines M1_I may be smaller than a linewidth of each of the first and second power lines M1_R1 and M1_R2.

The first metal layer M1 may further include first vias VI1. The first vias VI1 may be respectively below the interconnection lines M1_R1, M1_R2, and M1_I of the first metal layer M1. The active contact AC and the interconnection line of the first metal layer M1 may be electrically connected to each other through the first via VI1. The gate contact GC and the interconnection line of the first metal layer M1 may be electrically connected to each other through the first via VI1.

The interconnection line of the first metal layer M1 and the first via VI1 thereunder may be formed by separate processes. In an implementation, the interconnection line and the first via VI1 of the first metal layer M1 may be independently formed by respective single damascene processes. The semiconductor device according to the present embodiment may be fabricated using a sub-20 nm process.

A second metal layer M2 may be in the fourth interlayer insulating layer 140. The second metal layer M2 may include a plurality of second interconnection lines M2_I. Each of the second interconnection lines M2_I of the second metal layer M2 may be a line-shaped or bar-shaped pattern that extends in the first direction D1. In an implementation, the second interconnection lines M2_I may extend in the first direction D1 and parallel to each other.

The second metal layer M2 may further include second vias VI2, which are respectively below the second interconnection lines M2_I. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines of the first metal layer M1 may be formed of or include a conductive material that is the same as or different from those of the second metal layer M2. In an implementation, the interconnection lines of the first and second metal layers M1 and M2 may be formed of or include a metallic material (e.g., aluminum, copper, tungsten, ruthenium, molybdenum, or cobalt). In an implementation, a plurality of metal layers (e.g., M3, M4, M5, and so forth) may be additionally stacked on the fourth interlayer insulating layer 140. Each of the stacked metal layers may include interconnection lines, which are used as routing paths between cells.

The first and second source/drain patterns SD1 and SD2 will be described in more detail with reference to FIGS. 6 and 7.

The first and second source/drain patterns SD1 and SD2 may include side surfaces protruding toward the first to third semiconductor patterns SP1, SP2, and SP3. The protruding side surface may be a convex side surface. At least a portion of the protruding side surface may have a rounded profile or an angular profile. The side surfaces of the first and second source/drain patterns SD1 and SD2 may not protrude toward the gate electrodes GE.

Due to the protruding side surface of the first and second source/drain patterns SD1 and SD2, opposite side surfaces of each of the first to third semiconductor patterns SP1, SP2, and SP3 may be an inwardly recessed shape (e.g., complementary to the protruding shape). The opposite side surfaces may be concave. This may be because the opposite side surfaces of the first to third semiconductor patterns SP1, SP2, and SP3 may be recessed in a fabrication process to be described below.

Referring to FIG. 7, the first semiconductor patterns SP1 may include a first nanosheet NS1 and a second nanosheet NS2. The first nanosheet NS1 and the second nanosheet NS2 may be adjacent to each other, with the second source/drain pattern SD2 therebetween. The second inner electrode PO2 may include a first sub-electrode PO2a, which may be on the first nanosheet NS1, and a second sub-electrode PO2b, which may be on the second nanosheet NS2.

The second source/drain pattern SD2 may include a first portion PT1 between the first nanosheet NS1 and the second nanosheet NS2 and a second portion PT2 between the first sub-electrode PO2a and the second sub-electrode PO2b. When measured in the second direction D2, the first portion PT1 may have a first width WD1, and the second portion PT2 may have a second width WD2. The first width WD1 may be larger than the second width WD2.

In an implementation, a horizontal length of the first portion PT1 may be larger than a horizontal length of the second portion PT2. This may be because the second source/drain pattern SD2 may include a side surface protruding toward the first to third semiconductor patterns SP1, SP2, and SP3.

The first portion PT1 may have a side surface protruding toward the first and second nanosheets NS1 and NS2. At least a portion of the protruding side surface may have a rounded profile or an angular profile. The first and second nanosheets NS1 and NS2 may include an inwardly recessed side surface. The first and second nanosheets NS1 and NS2 may include a concave side surface in contact with the second source/drain pattern SD2.

A blocking layer BL may be between the second source/drain pattern SD2 and the active pattern AP2. A mean thickness of the blocking layer BL may be smaller than a mean thickness of the first to third semiconductor patterns SP1, SP2, and SP3 (e.g., as measured in the vertical third direction D3). At least a portion of a side surface of the blocking layer BL may be in contact (e.g., direct contact) with the gate insulating layer GI. At least a portion of the side surface of the blocking layer BL may cover or contact at least a portion of the side surface of the inner spacer IP.

The blocking layer BL may be formed of or include, e.g., silicon-germanium (SiGe). In an implementation, a germanium concentration of the blocking layer BL may be higher than the germanium concentrations of the second source/drain patterns SD1 and SD2. In an implementation, the germanium concentration of the blocking layer BL may range from, e.g., 5 at % to 10 at %.

The first source/drain pattern SD1 may have substantially the same features as the second source/drain pattern SD2. In an implementation, the germanium concentration of the blocking layer BL may be lower than a germanium concentration of the first source/drain pattern SD1. In an implementation, the germanium concentration of the blocking layer BL may range from 5 at % to 10 at %.

The first and second source/drain patterns SD1 and SD2 may include the side surfaces protruding toward the first to third semiconductor patterns SP1, SP2, and SP3, and an impurity-doped layer in the first and second source/drain patterns SD1 and SD2 may be formed to be close to the first to third semiconductor patterns SP1, SP2, and SP3. The first and second source/drain patterns SD1 and SD2 may not have a shape protruding toward the first to third inner electrodes PO1, PO2, and PO3 of the gate electrode GE, and a distance between the impurity-doped layer and the first to third inner electrodes PO1, PO2, and PO3 may be unchanged.

A depth of the first and second source/drain patterns SD1 and SD2 may be increased by a recessing process for forming the protruding side surface. In an implementation, the blocking layer BL may be on the bottom surfaces of the first and second recesses RS1 and RS2, and it may be possible to prevent the substrate 100 from being more deeply recessed. In an implementation, the blocking layer BL may be used to help control a depth of the first and second source/drain patterns SD1 and SD2. As a result, it may be possible to improve electrical and reliability characteristics of a semiconductor device.

FIGS. 8A to 15D are sectional views of stages in a method of fabricating a semiconductor device, according to an embodiment. In detail, FIGS. 8A, 9A, 10A, 12A, 13A, 14A, and 15A are sectional views taken along the line A-A' of FIG. 4. FIGS. 12B, 13B, 14B, and 15B are sectional views taken along the line B-B' of FIG. 4. FIGS. 10B, 12C, 13C, 14C, and 15C are sectional views taken along the line C-C' of FIG. 4. FIGS. 8B, 9B, 10C, 12D, 13D, 14D, and 15D are sectional views taken along the line D-D' of FIG. 4.

Figure 8A:
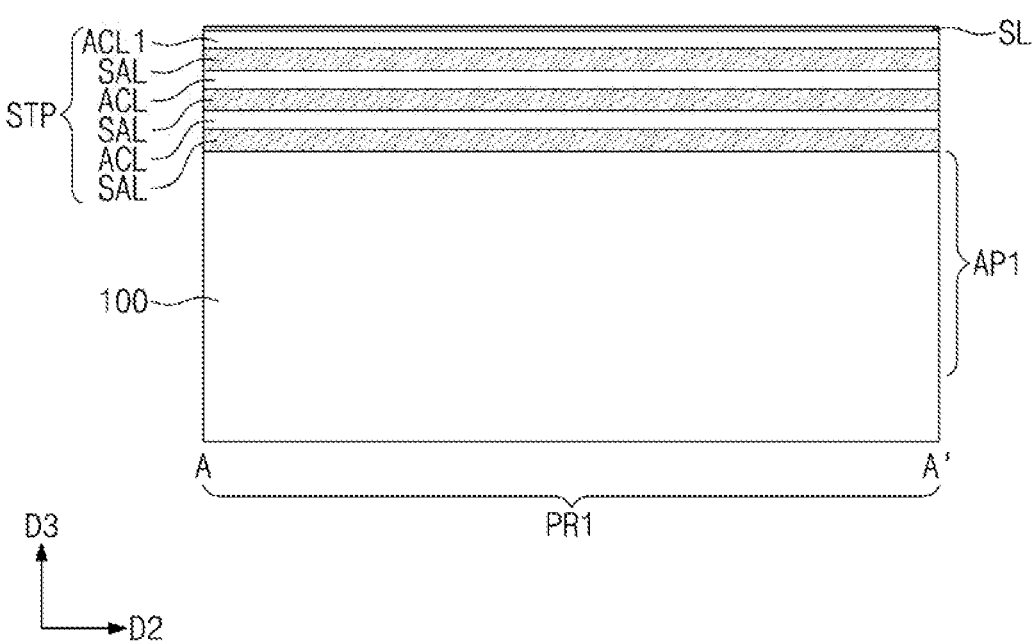
FIGS. 8A to 15D are sectional views of stages in a method of fabricating a semiconductor device, according to an embodiment.
Figure 8B:
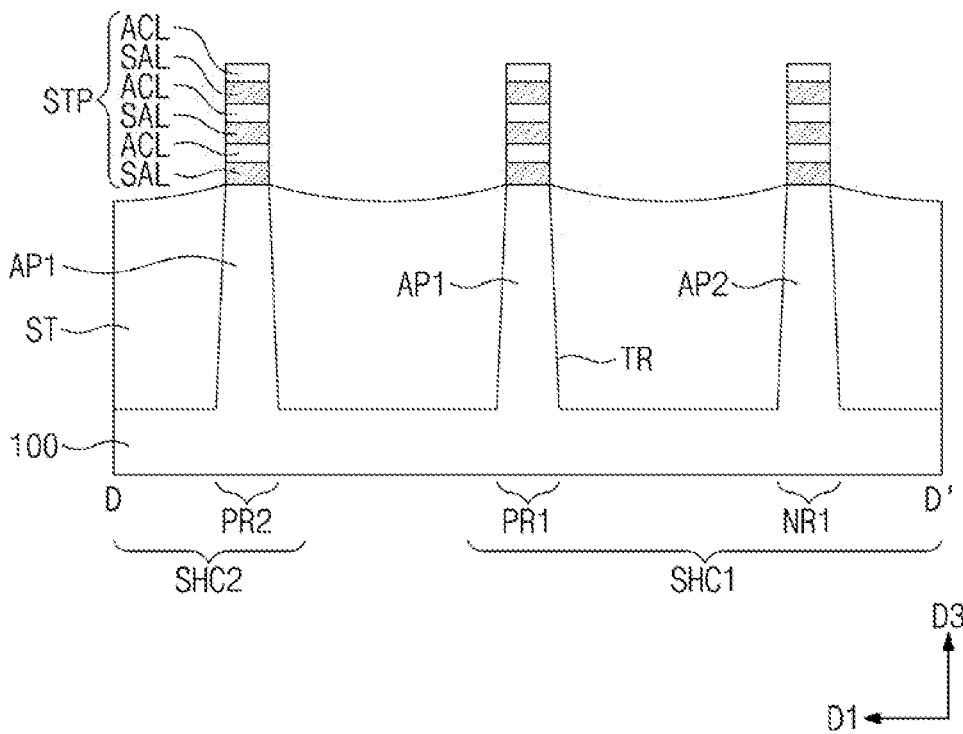

Referring to FIGS. 8A and 8B, the substrate 100 may be provided, and in this case, the substrate 100 may include first and second PMOSFET regions PR1 and PR2 and first and second NMOSFET regions NR1 and NR2. Active layers ACL and sacrificial layers SAL may be alternately stacked on the substrate 100. The active and sacrificial layers ACL and SAL may be formed of or include, e.g., silicon (Si), germanium (Ge), or silicon germanium (SiGe), and the active and sacrificial layers ACL and SAL may be formed of different materials from each other.

The sacrificial layer SAL may be formed of or include a material having an etch selectivity with respect to the active layer ACL. In an implementation, the active layers ACL may be formed of or include silicon (Si), and the sacrificial layers SAL may be formed of or include, e.g., silicon germanium (SiGe). A germanium concentration of each of the sacrificial layers SAL may range from, e.g., 10 at % to 30 at %.

The active layer ACL may include a first active layer ACL1 at the highest level thereof. The sacrificial layer SL may be on the first active layer ACL1. The sacrificial layer SL may be formed of or include a material having an etch selectivity with respect to the active layer ACL. In an implementation, the sacrificial layer SL may be formed of or include, e.g., silicon (Si).

Mask patterns may be respectively formed on the first and second PMOSFET regions PR1 and PR2 and the first and second NMOSFET regions NR1 and NR2 of the substrate 100. The mask pattern may be a line- or bar-shaped pattern that extends in the second direction D2.

A patterning process using the mask patterns as an etch mask may be performed to form the trench TR defining the first and second active patterns AP1 and AP2. The first active pattern AP1 may be formed on each of the first and second PMOSFET regions PR1 and PR2. The second active pattern AP2 may be formed on each of the first and second NMOSFET regions NR1 and NR2.

A stacking pattern STP may be formed on each of the first and second active patterns AP1 and AP2. The stacking pattern STP may include the active layers ACL and the sacrificial layers SAL which are alternately stacked. The stacking pattern STP may be formed along with the first and second active patterns AP1 and AP2, during the patterning process.

The device isolation layer ST may be formed to fill the trench TR. In an implementation, an insulating layer may be formed on the substrate 100 to cover the first and second active patterns AP1 and AP2 and the stacking patterns STP. The insulating layer may be recessed to expose the stacking patterns STP and form the device isolation layer ST.

The device isolation layer ST may be formed of or include an insulating material (e.g., silicon oxide). The stacking patterns STP may be at a level higher than the device isolation layer ST and may be exposed to the outside of the device isolation layer ST. In an implementation, the stacking patterns STP may protrude vertically above the device isolation layer ST.

Figure 9A:
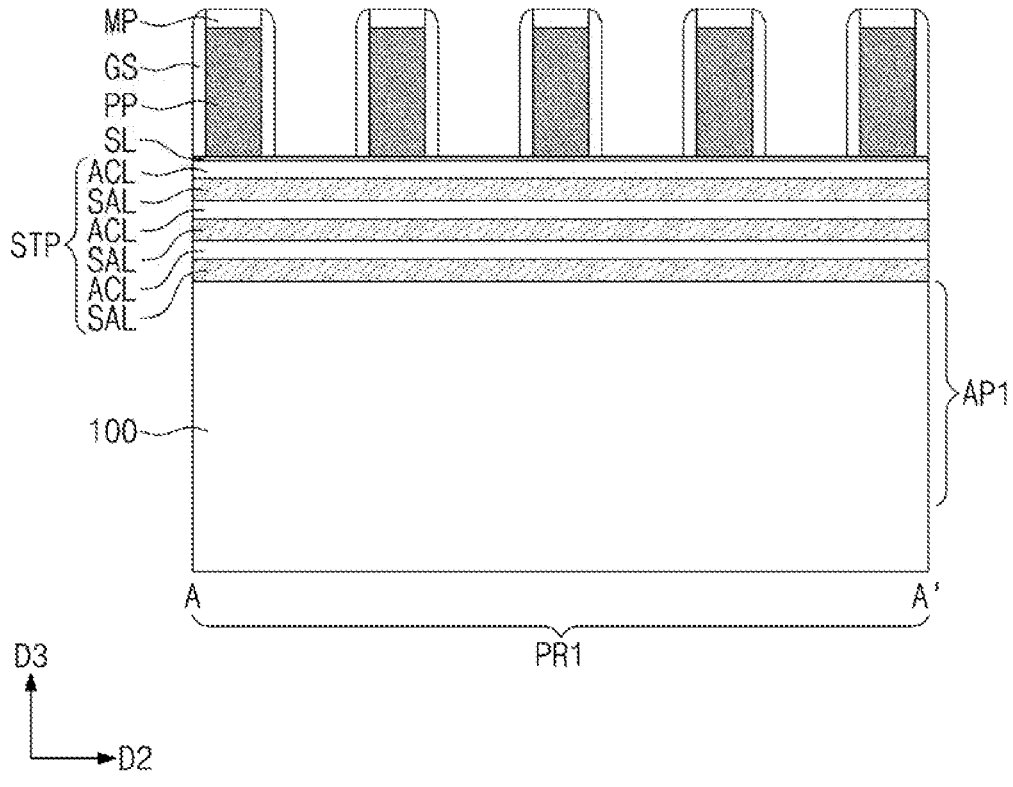
Figure 9B:
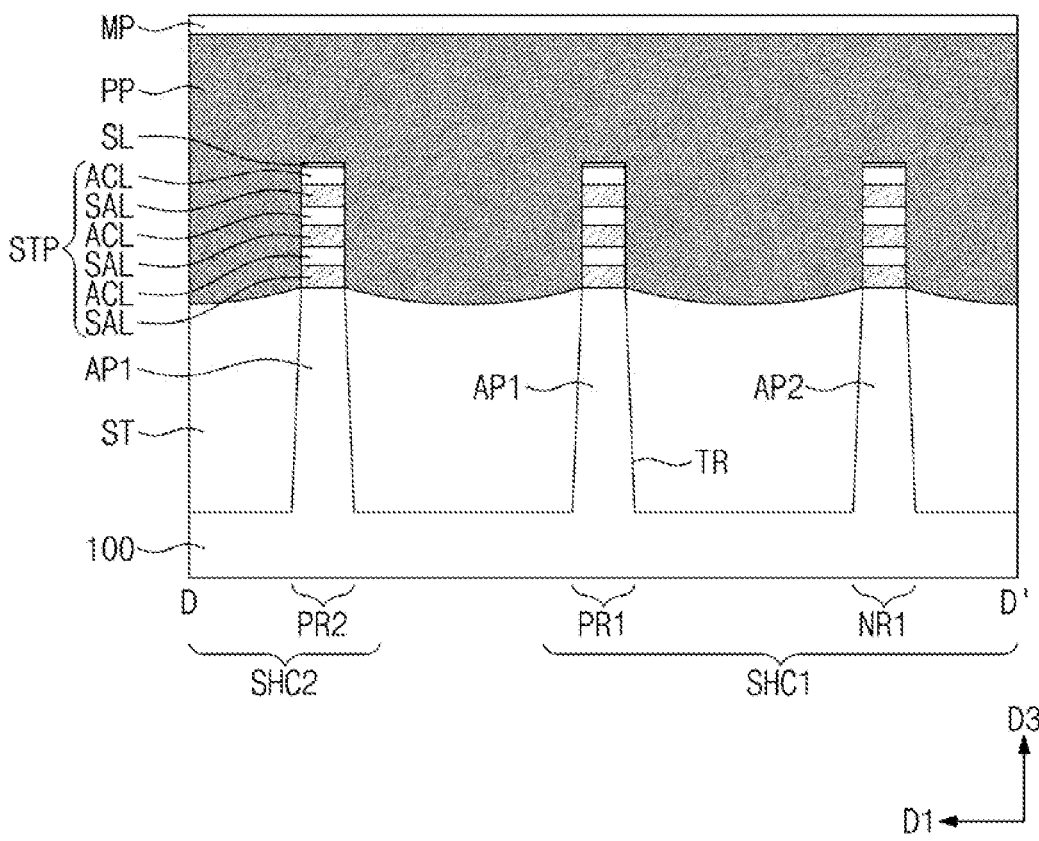

Referring to FIGS. 9A and 9B, sacrificial patterns PP may be formed on the substrate 100 to cross the stacking patterns STP. Each of the sacrificial patterns PP may be a line- or bar-shaped pattern extending in the first direction D1. The sacrificial patterns PP may be arranged at a first pitch in the second direction D2.

In an implementation, the formation of the sacrificial patterns PP may include forming a silicon layer on the substrate 100, forming hard mask patterns MP on the silicon layer, and patterning the silicon layer using the hard mask patterns MP as an etch mask. The silicon layer may be formed of or include polysilicon.

A pair of the gate spacers GS may be formed on opposite side surfaces of each of the sacrificial patterns PP. The formation of the gate spacers GS may include conformally forming a gate spacer layer on the substrate 100 and anisotropically etching the gate spacer layer. The gate spacer GS may be a multi-layered structure including the first spacer GS1 and the second spacer GS2, as previously described with reference to FIG. 6.

Figure 10A:
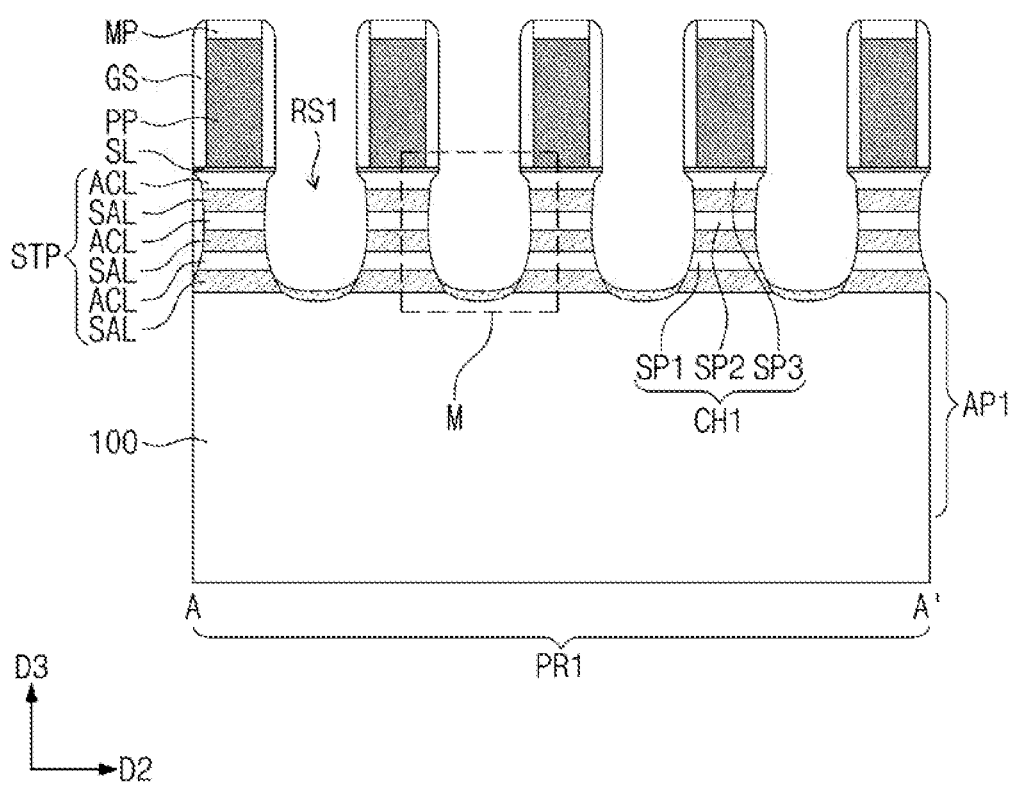
Figure 10B:
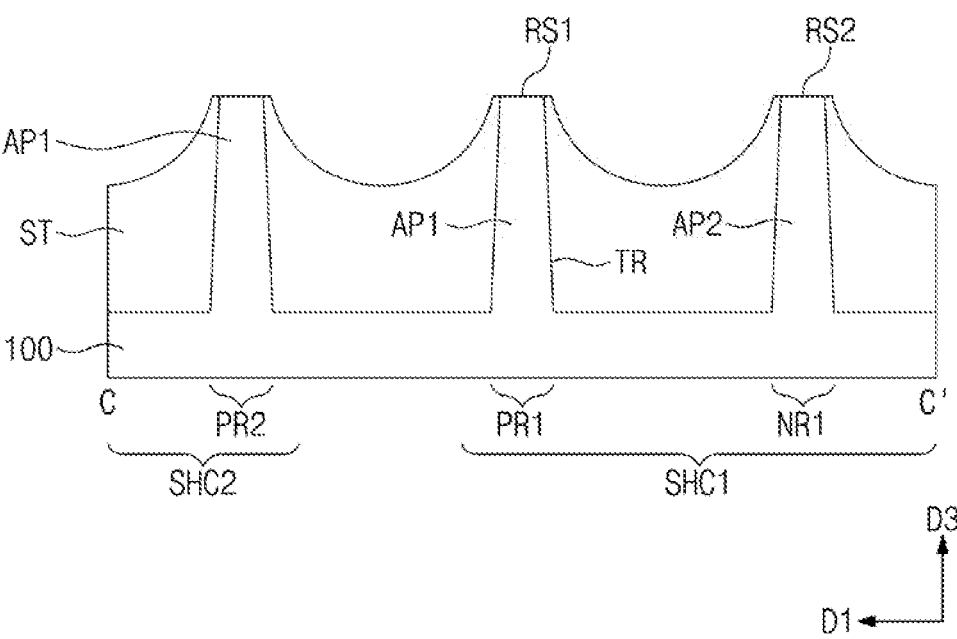
Figure 10C:
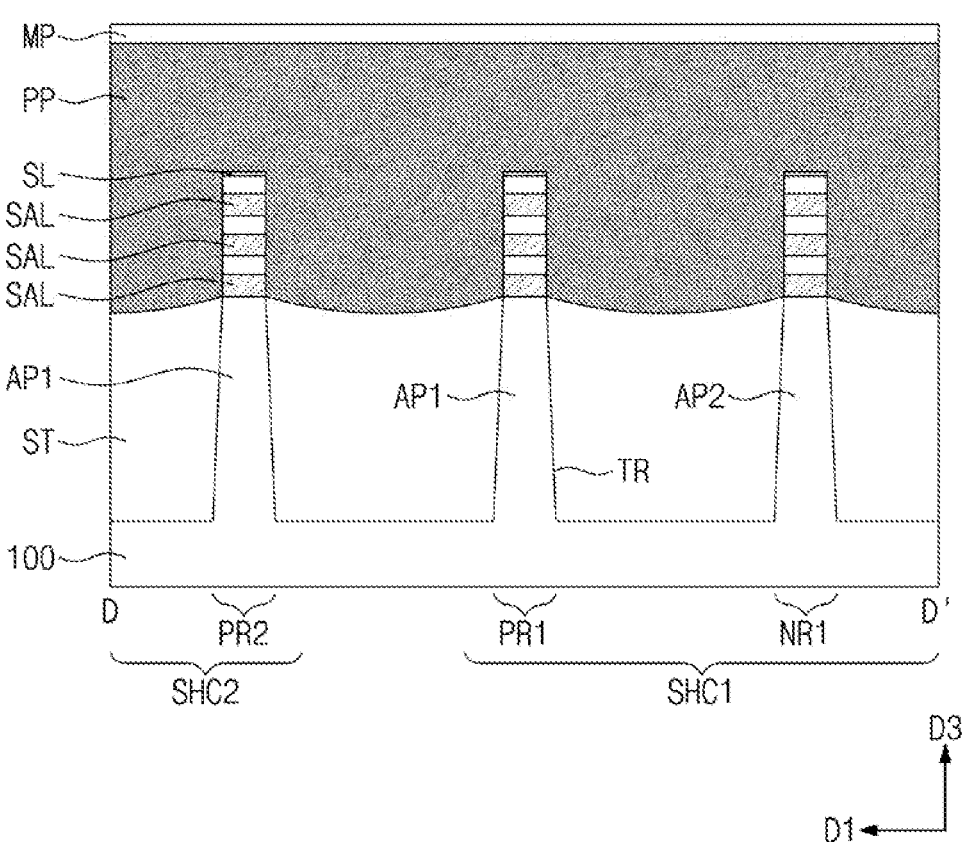

Referring to FIGS. 10A to 10C, the first recesses RS1 may be formed in the stacking pattern STP on the first active pattern AP1. The second recesses RS2 may be formed in the stacking pattern STP on the second active pattern AP2. During the formation of the first and second recesses RS1 and RS2, the device isolation layer ST may also be recessed at both sides of each of the first and second active patterns AP1 and AP2 (e.g., see FIG. 11C).

In an implementation, the first recesses RS1 may be formed by etching the stacking pattern STP on the first active pattern AP1 using the hard mask patterns MP and the gate spacers GS as an etch mask. The first recess RS1 may be formed between a pair of the sacrificial patterns PP. The formation of the first recess RS1 may include additionally performing a selective etching process on exposed portions of the sacrificial layers SAL. Accordingly, the first recess RS1 may be formed to have an inner side surface of a wavy shape.

The second recesses RS2 in the stacking pattern STP on the second active pattern AP2 may be formed by the same method as that for the first recesses RS1. Referring to FIG. 7, however, the formation of the second recess RS2 may further include forming the inner spacers IP in recessed regions that are formed by selectively etching the sacrificial layer SAL. As a result, an inner surface of some portions of the second recess RS2 may not have a wavy shape, unlike the inner surface of the first recess RS1.

In an implementation, the inner spacer IP may be formed by the following method. Each of the sacrificial layers SAL may be indented by the etching process to form an indent region. Due to the indent region, the sacrificial layer SAL may have a concave side surface.

The inner spacer IP may be formed to fill the indent region. The formation of the inner spacer IP may include forming an insulating layer through the first recess RS1 to fill the indent region and performing a wet etching process on the insulating layer, which is exposed through the indent region. The insulating layer may include, e.g., a silicon oxide layer, a silicon oxynitride layer, or a silicon nitride layer. The inner spacers IP may be respectively between the first recess RS1 and the sacrificial layers SAL.

The first to third semiconductor patterns SP1, SP2, and SP3, which are sequentially stacked between adjacent ones of the first recesses RS1, may be respectively formed from the active layers ACL. The first to third semiconductor patterns SP1, SP2, and SP3, which are sequentially stacked between adjacent ones of the second recesses RS2, may be respectively formed from the active layers ACL. The first to third semiconductor patterns SP1, SP2, and SP3 between adjacent ones of the first recesses RS1 may constitute the first channel pattern CH1. The first to third semiconductor patterns SP1, SP2, and SP3 between adjacent ones of the second recesses RS2 may constitute the second channel pattern CH2. Even when the inner spacers IP are formed, the first to third semiconductor patterns SP1, SP2, and SP3 may be exposed by the first recess RS1.

Figure 11A:
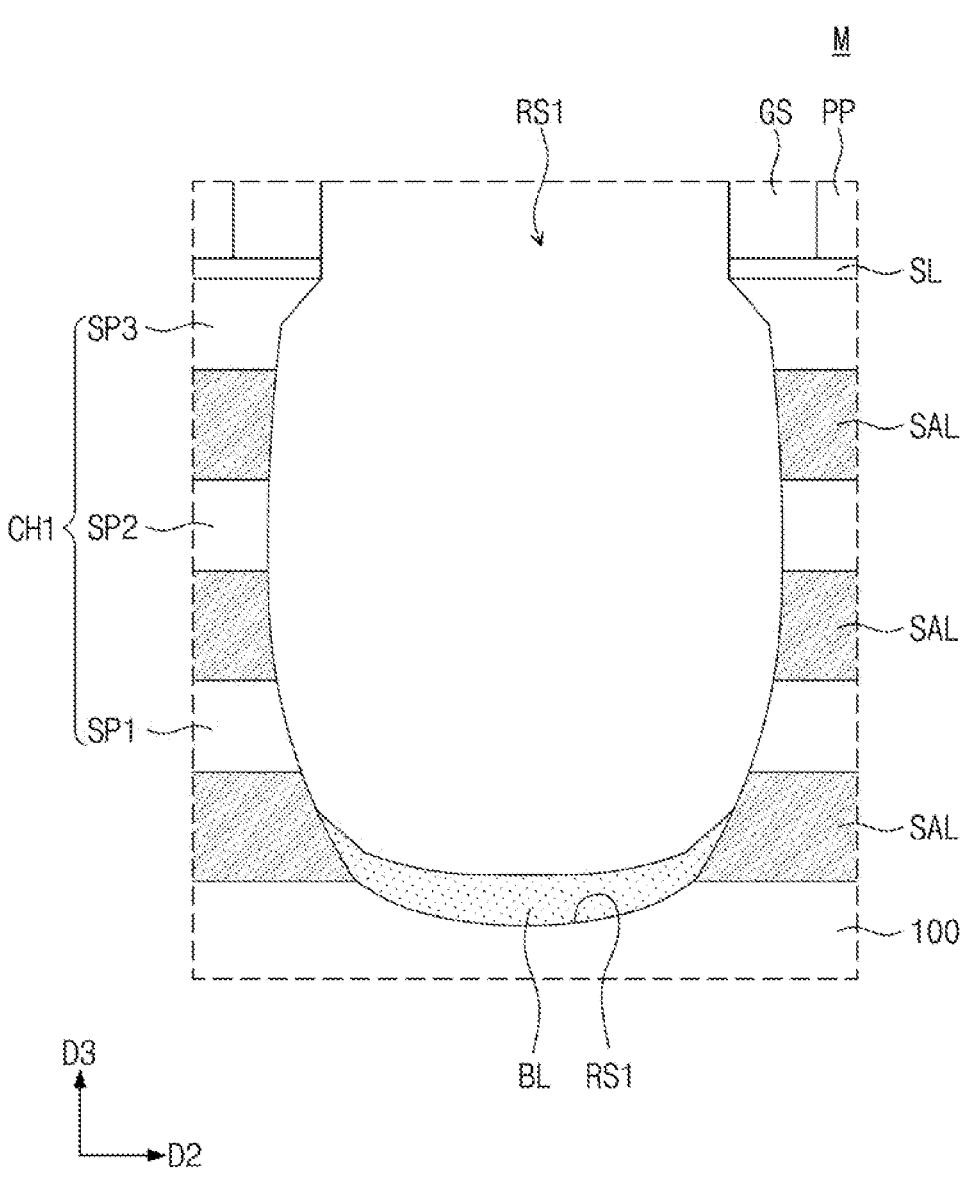
Figure 11B:
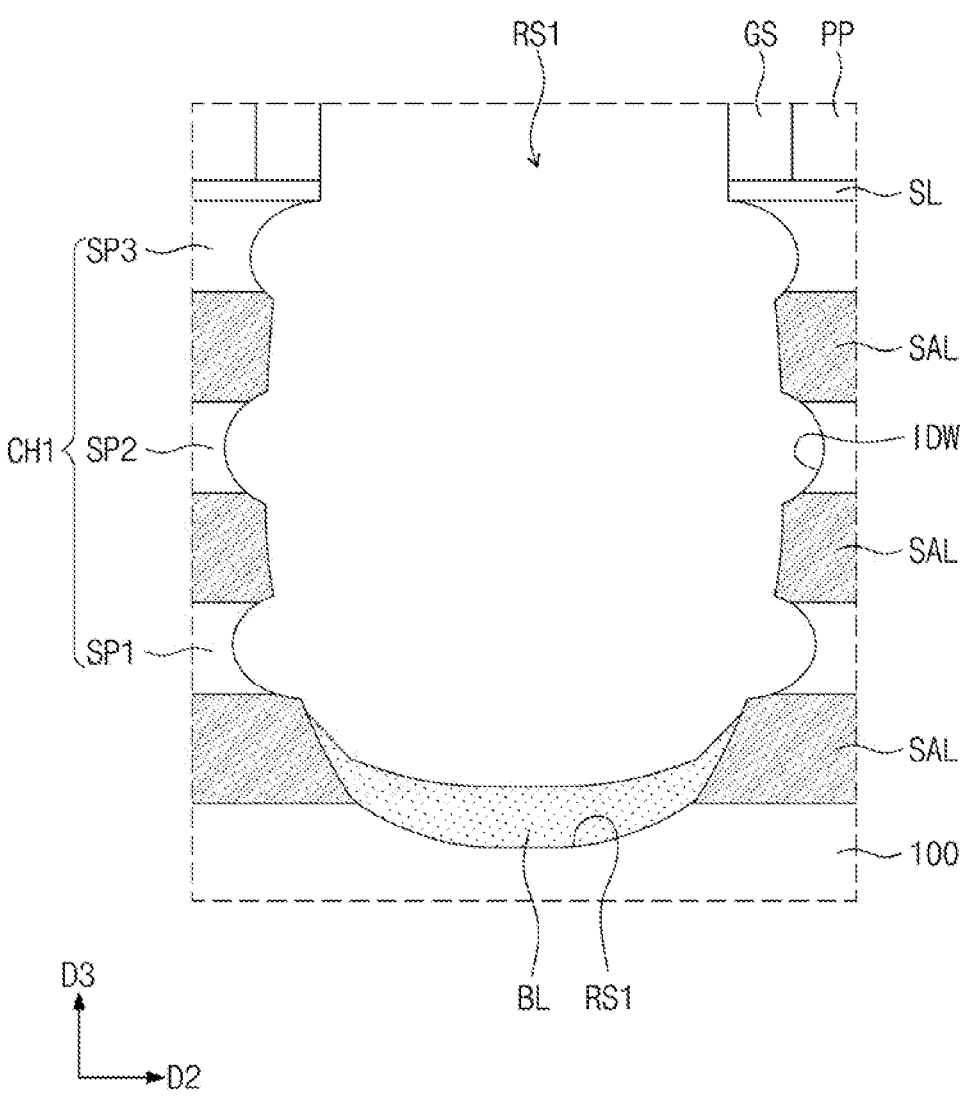
Figure 11C:
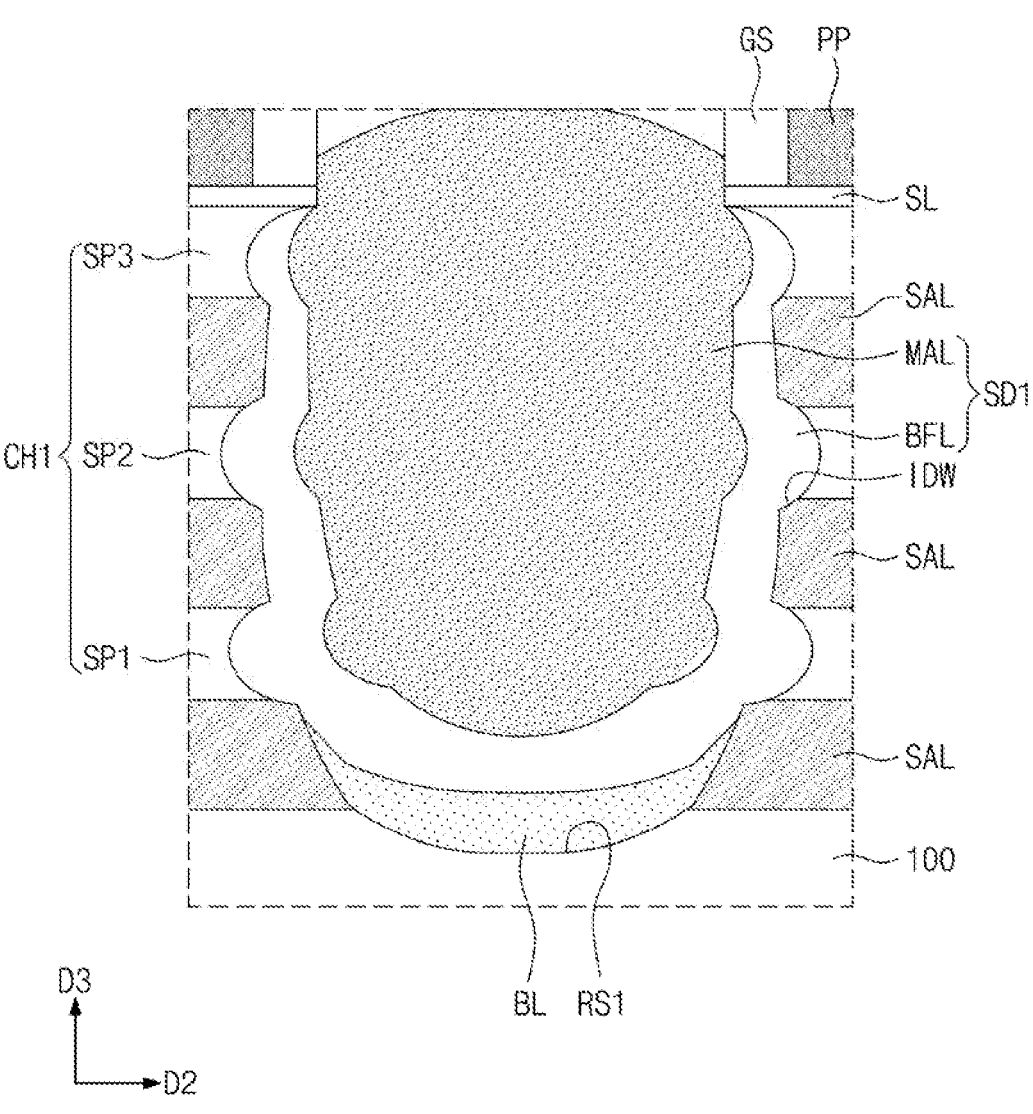
Figure 12A:
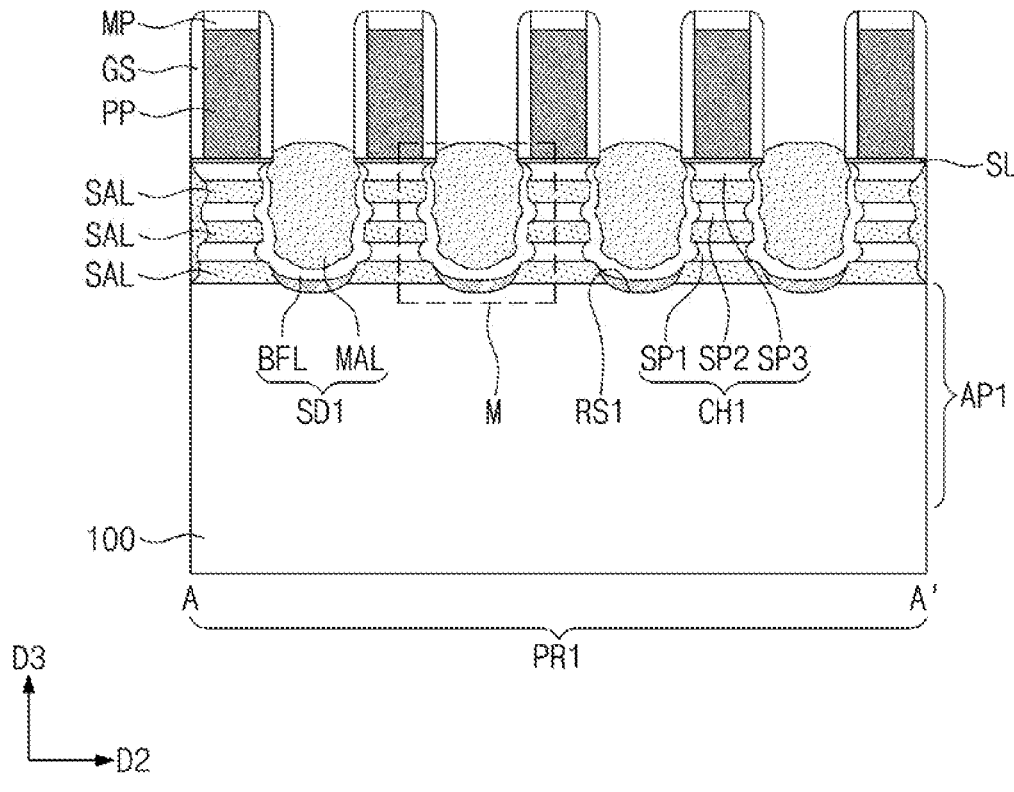
Figure 12B:
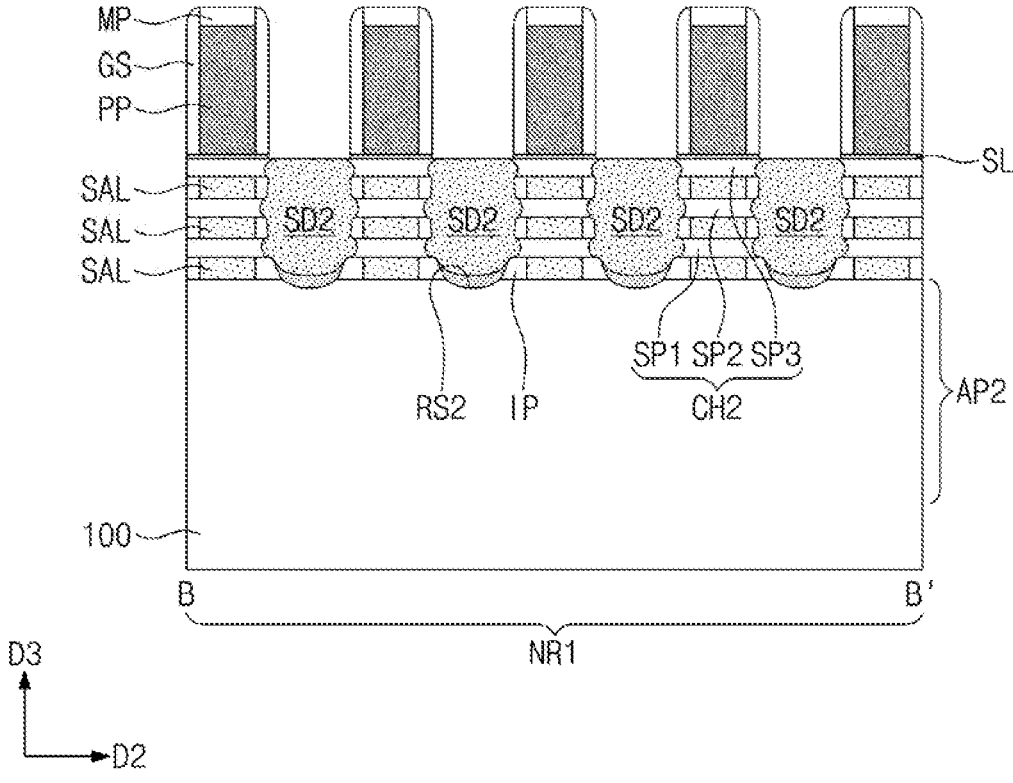
Figure 12C:
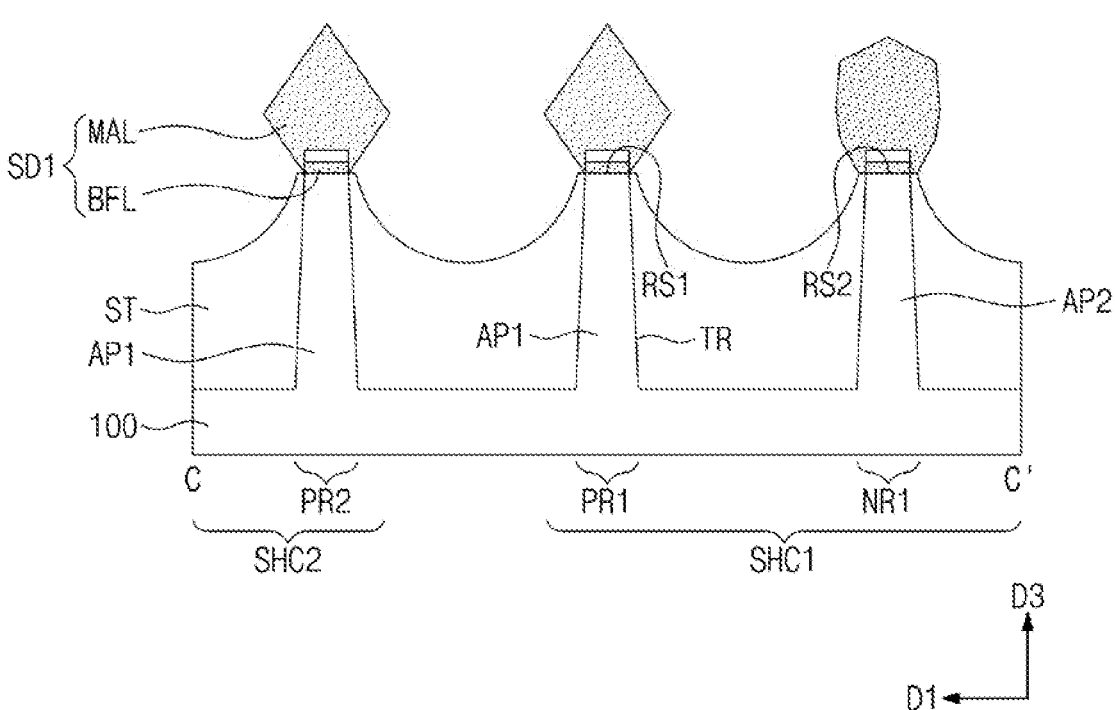
Figure 12D:
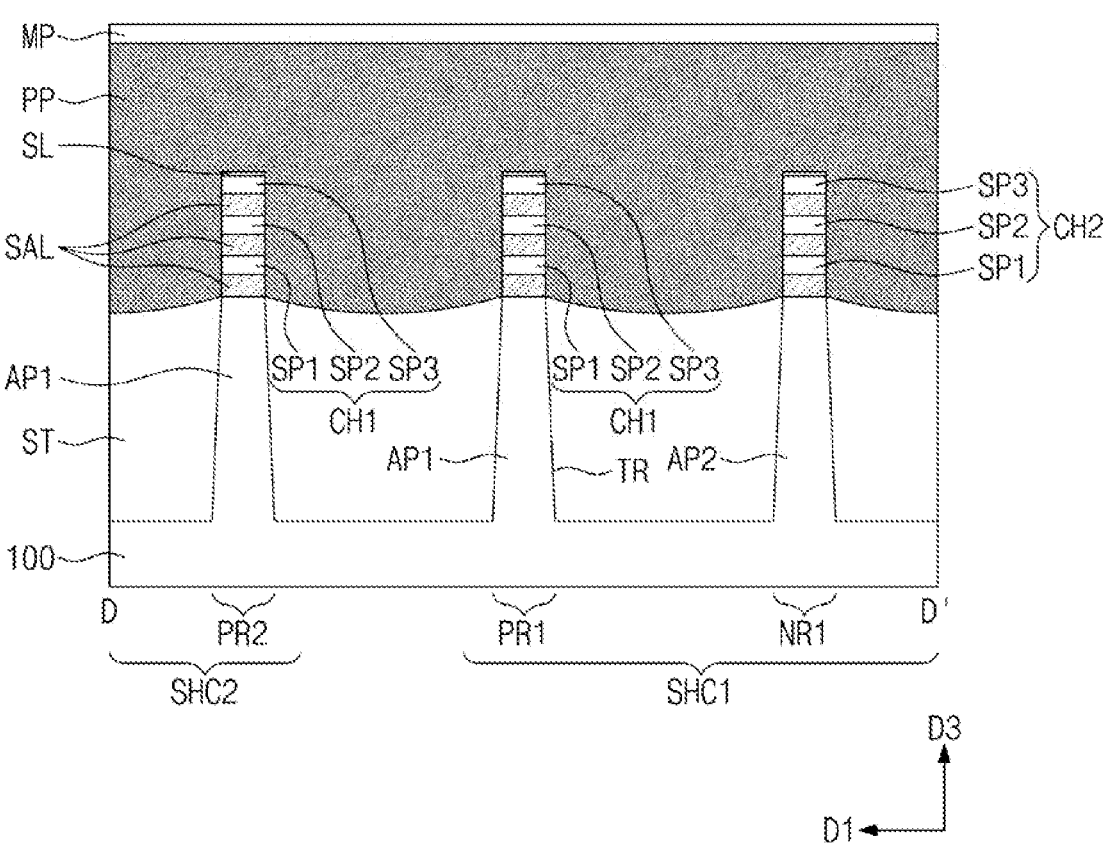
Figure 13A:
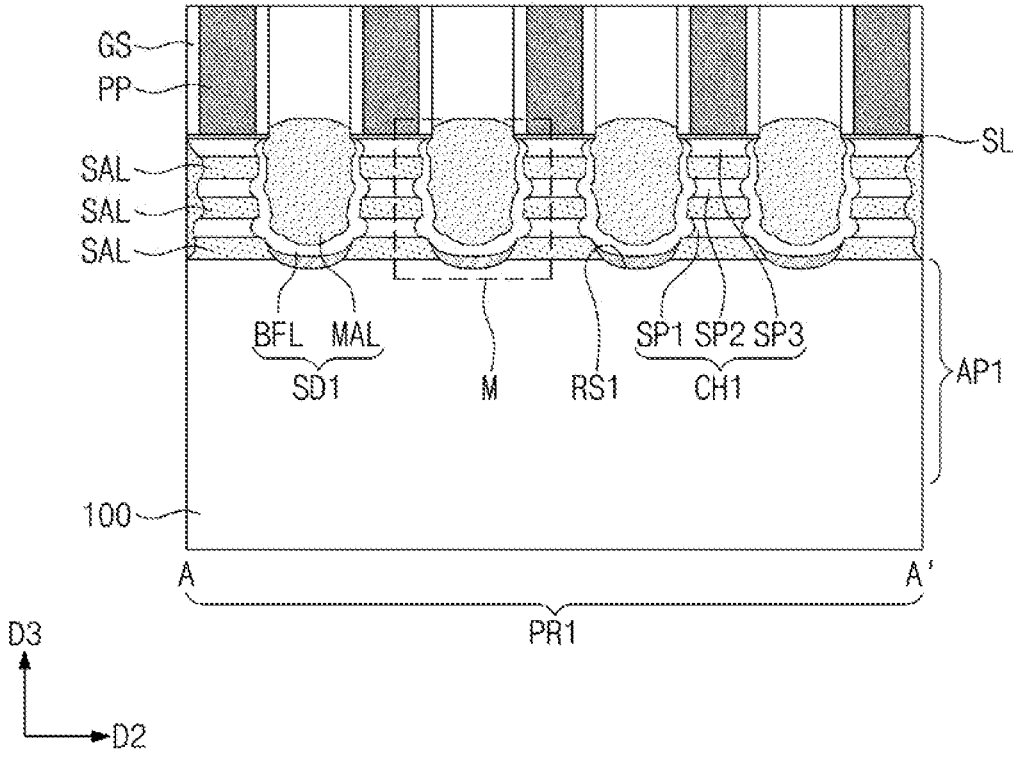
Figure 13B:
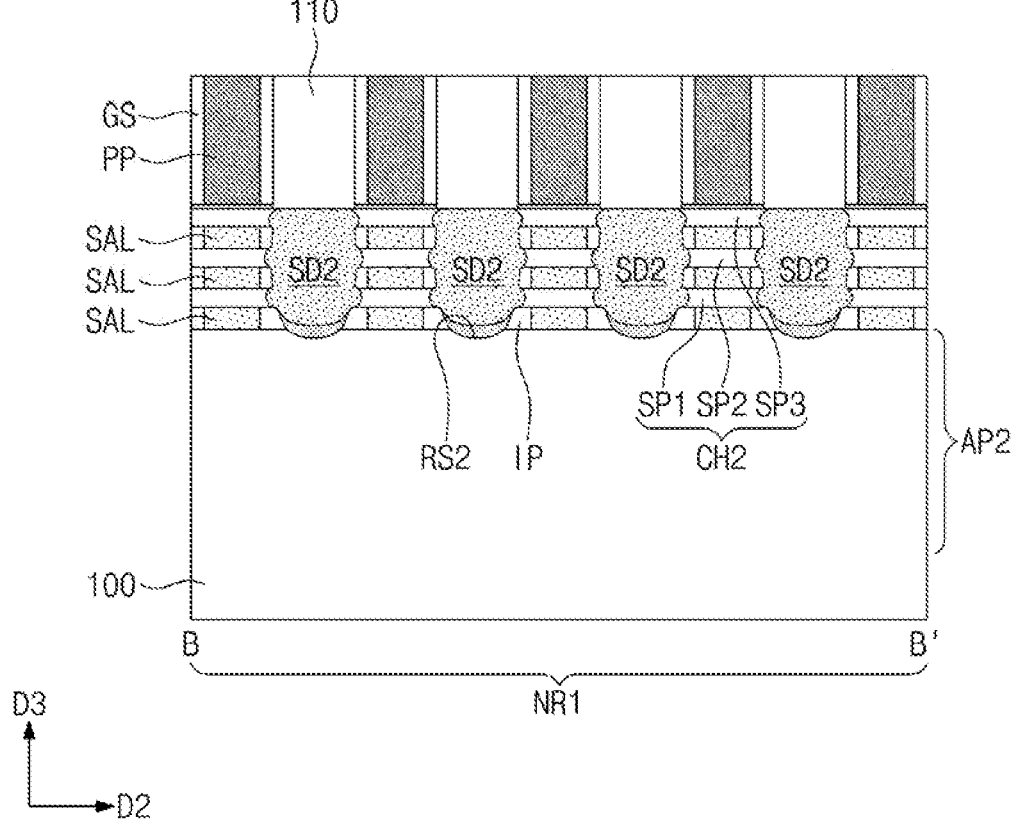
Figure 13C:
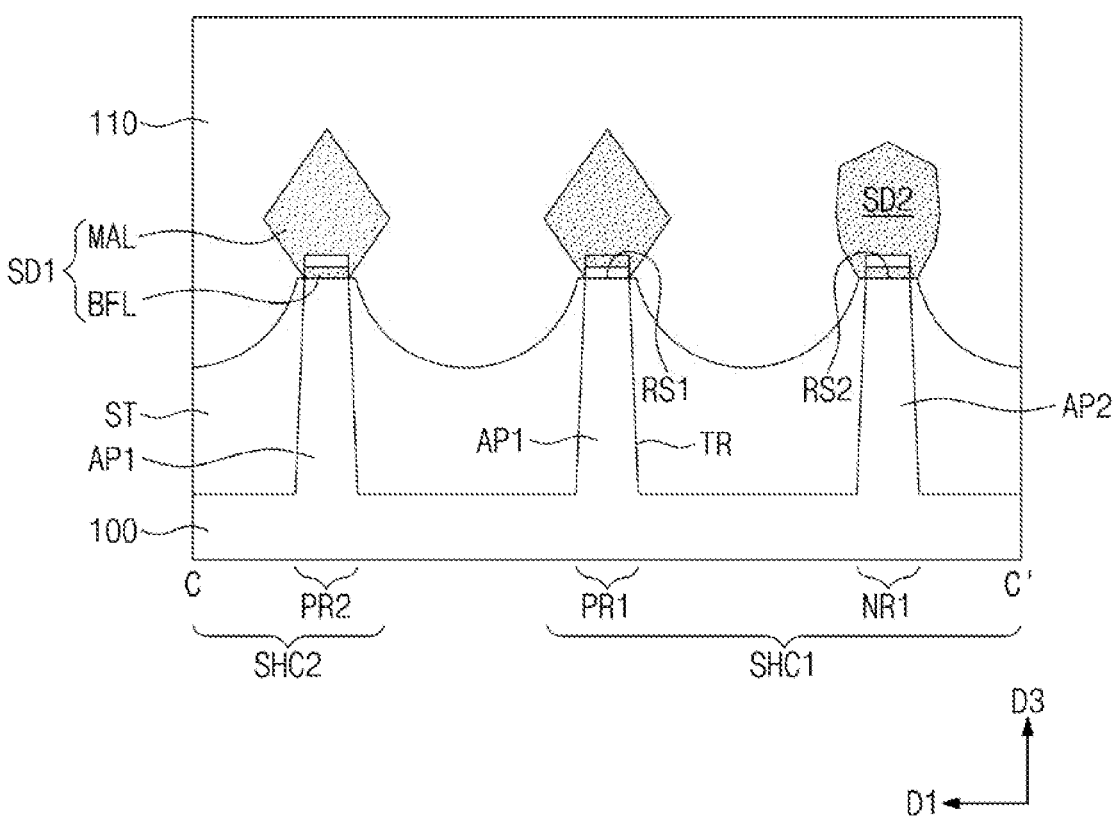
Figure 13D:
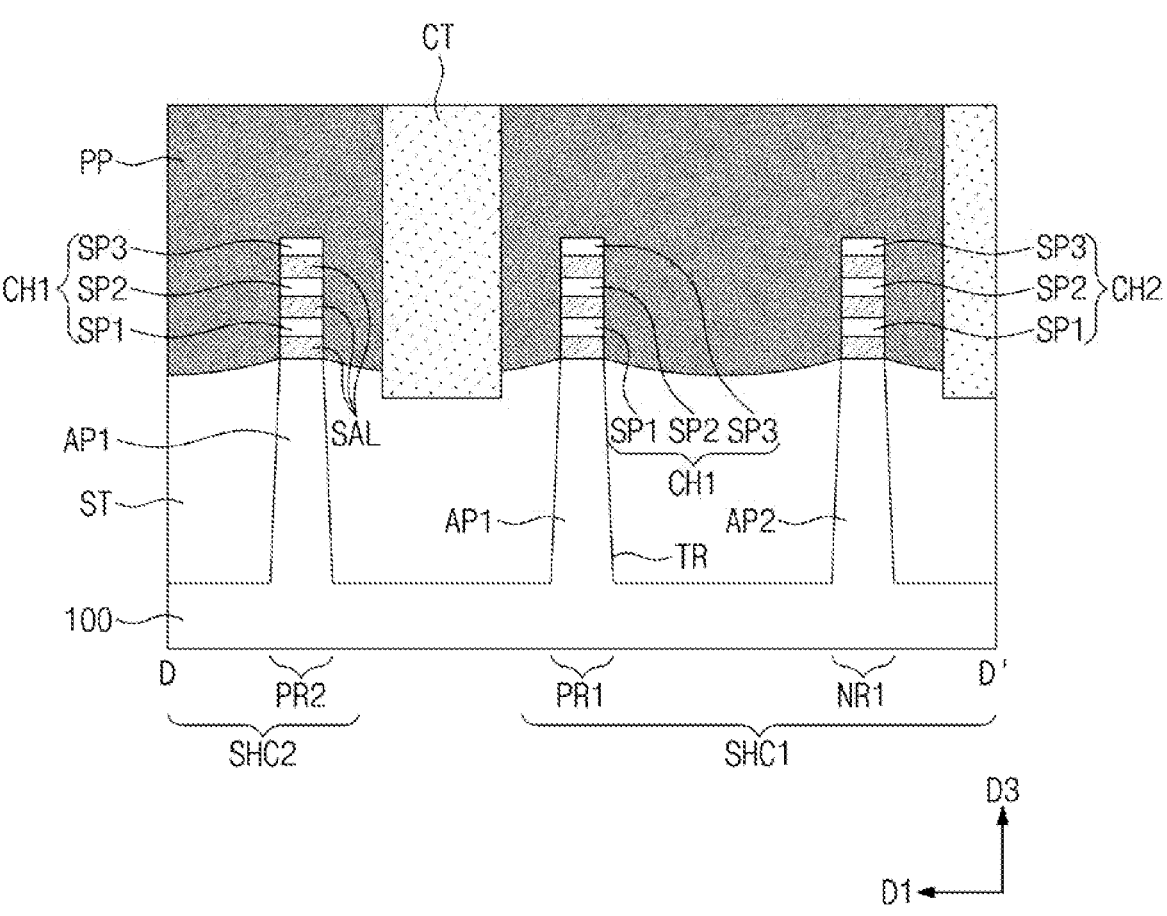

FIGS. 11A to 11C are enlarged sectional views illustrating a portion 'M' of FIG. 10A for illustrating a method of forming the first and second source/drain patterns SD1 and SD2.

Referring to FIG. 11A, a bake process may be performed on the first and second recesses RS1 and RS2. In an implementation, opposite side surfaces of the first and second recesses RS1 and RS2 may be melted by thermally treating the first and second recesses RS1 and RS2. The sacrificial layer SAL and the active layer ACL may be partially melted by heat supplied in the bake process, and the melted material may accumulate on or at the bottom surfaces of the first and second recesses RS1 and RS2 to form the blocking layer BL. The blocking layer BL may be formed of or include, e.g., silicon-germanium (SiGe). In an implementation, a germanium concentration of the blocking layer BL may range from, e.g., 5 at % to 10 at %.

A mean thickness of the blocking layer BL may be smaller than a mean thickness of the sacrificial layer SAL and a mean thickness of the active layer ACL. The side surface of the blocking layer BL may cover at least a portion of the side surface of the lowermost one of the sacrificial layers SAL.

Referring to FIG. 11B, a selective etching process may be performed on the first to third semiconductor patterns SP1, SP2, and SP3 exposed by the first recess RS1. The side surfaces of the first to third semiconductor patterns SP1, SP2, and SP3 may be partially removed by the selective etching process. The selective etching process may be a wet etching process. In an implementation, the selective etching process may include a wet etching process that is performed to selectively remove only silicon (Si).

Each of the first to third semiconductor patterns SP1, SP2, and SP3 may be partially etched to form an indented side surface IDW. In an implementation, the first and second recesses RS1 and RS2 may include an inner side surface IDW protruding toward the first to third semiconductor patterns SP1, SP2, and SP3. At least a portion of the protruding inner side surface IDW may have a rounded profile or an angular profile.

The sacrificial layer SL on the third semiconductor pattern SP3 may help prevent the third semiconductor pattern SP3 from being etched by the selective etching process. The blocking layer BL may not be removed or may be only partially removed by the selective etching process. Due to the blocking layer BL, the first and second active patterns AP1 and AP2 may not be exposed to the outside (e.g., or to an etchant). The blocking layer BL may help prevent the first and second active patterns AP1 and AP2 from being etched by the etching process. In an implementation, the blocking layer BL may help prevent the first and second source/drain patterns SD1 and SD2 from being deeply formed in the first and second recesses RS1 and RS2.

Referring to FIGS. 11C to 12D, the first source/drain patterns SD1 may be formed in the first recesses RS1, respectively. In an implementation, a buffer layer BFL may be formed by a SEG process using an inner surface of the first recess RS1 as a seed layer. The buffer layer BFL may be grown using the first to third semiconductor patterns SP1, SP2, and SP3 and the substrate 100, which are exposed through the first recess RS1, as a seed layer. In an implementation, the SEG process may include a chemical vapor deposition (CVD) process or a molecular beam epitaxy (MBE) process.

The buffer layer BFL may contain a semiconductor material (e.g., SiGe) whose lattice constant is larger than that of a semiconductor material of the substrate 100. The buffer layer BFL may contain a relatively low concentration of germanium (Ge). In an implementation, the buffer layer BFL may contain only silicon (Si), without germanium (Ge). A germanium concentration of the buffer layer BFL may range from, e.g., 0 at % to 10 at %.

A SEG process may be performed on the buffer layer BFL to form a main layer MAL. The main layer MAL may be formed to fully fill (e.g., remaining parts of) the first recess RS1. The main layer MAL may contain a relatively high concentration of germanium. In an implementation, the germanium concentration of the main layer MAL may range from, e.g., 30 at % to 70 at %.

The first source/drain pattern SD1 may be doped in-situ with p-type impurities (e.g., boron, gallium, or indium) during the formation of the buffer and main layers BFL and MAL. In an implementation, impurities may be injected into the first source/drain pattern SD1, after the formation of the first source/drain pattern SD1.

The second source/drain patterns SD2 may be formed in the second recesses RS2, respectively. In an implementation, the second source/drain pattern SD2 may be formed by a SEG process using an inner surface of the second recess RS2 as a seed layer. In an implementation, the second source/drain pattern SD2 may be formed of or include the same semiconductor material (e.g., Si) as the substrate 100.

During the formation of the second source/drain pattern SD2, the second source/drain pattern SD2 may be doped in-situ with n-type impurities (e.g., phosphorus, arsenic, or antimony). In an implementation, impurities may be injected into the second source/drain pattern SD2, after the formation of the second source/drain pattern SD2.

The first and second source/drain patterns SD1 and SD2 may include side surfaces protruding toward the first to third semiconductor patterns SP1, SP2, and SP3. At least a portion of the protruding side surface may have a rounded profile or an angular profile. The first and second source/drain patterns SD1 and SD2 may have an uneven (e.g., wavy or undulating) shape. The bottom surfaces of the first and second source/drain patterns SD1 and SD2 may be in direct contact with a top surface of the blocking layer BL.

Referring to FIGS. 13A to 13D, the first interlayer insulating layer 110 may be formed to cover the first and second source/drain patterns SD1 and SD2, the hard mask patterns MP, and the gate spacers GS. In an implementation, the first interlayer insulating layer 110 may include a silicon oxide layer.

The first interlayer insulating layer 110 may be planarized to expose the top surfaces of the sacrificial patterns PP. The planarization of the first interlayer insulating layer 110 may be performed using an etch-back or chemical-mechanical polishing (CMP) process. The hard mask patterns MP may be fully removed during the planarization process. As a result, a top surface of the first interlayer insulating layer 110 may be coplanar with the top surfaces of the sacrificial patterns PP and the top surfaces of the gate spacers GS.

A photolithography process may be performed to selectively open a region of the sacrificial pattern PP. In an implementation, a region of the sacrificial pattern PP on the third and fourth borders BD3 and BD4 of the first single height cell SHC1 may be selectively opened. The opened region of the sacrificial pattern PP may be selectively etched and removed. A gate cutting pattern CT may be formed by filling a space, which is formed by removing the sacrificial pattern PP, with an insulating material.

Referring to FIGS. 14A to 14D, the exposed sacrificial patterns PP may be selectively removed. As a result of the removal of the sacrificial patterns PP, an outer region ORG may be formed to expose the first and second channel patterns CH1 and CH2 (e.g., see FIG. 14D). The removal of the sacrificial patterns PP may include a wet etching process which may be performed using an etching solution capable of selectively etching polysilicon.

Figure 14A:
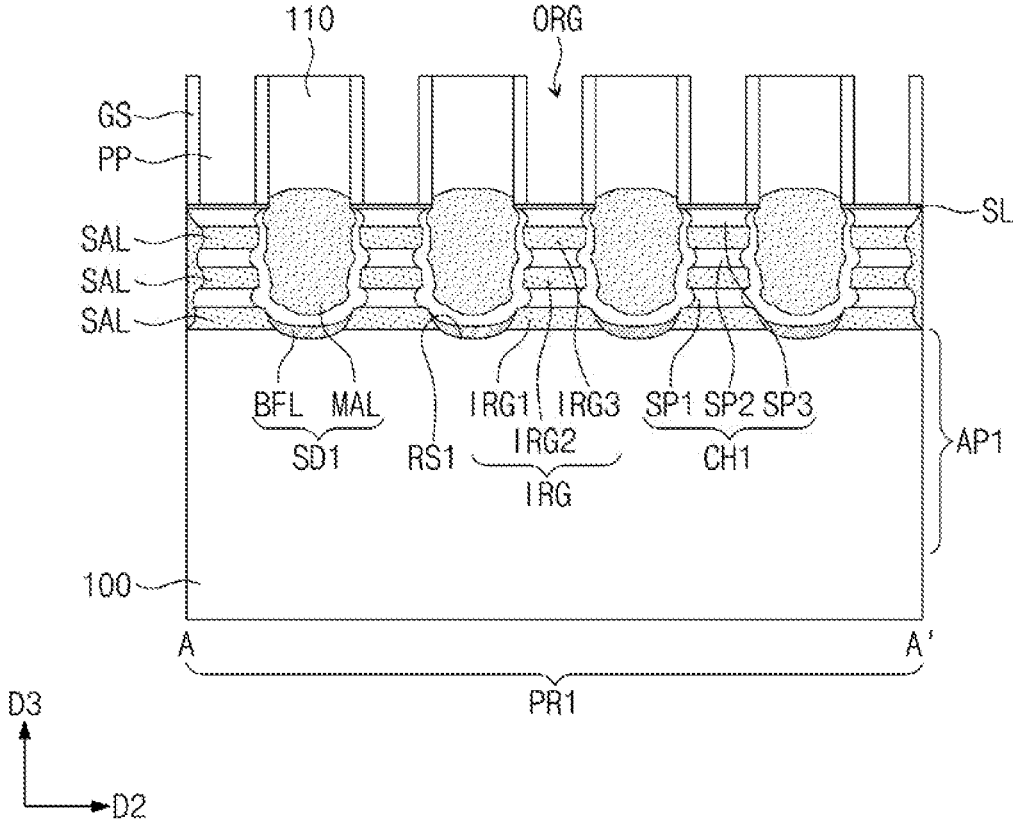
Figure 14B:
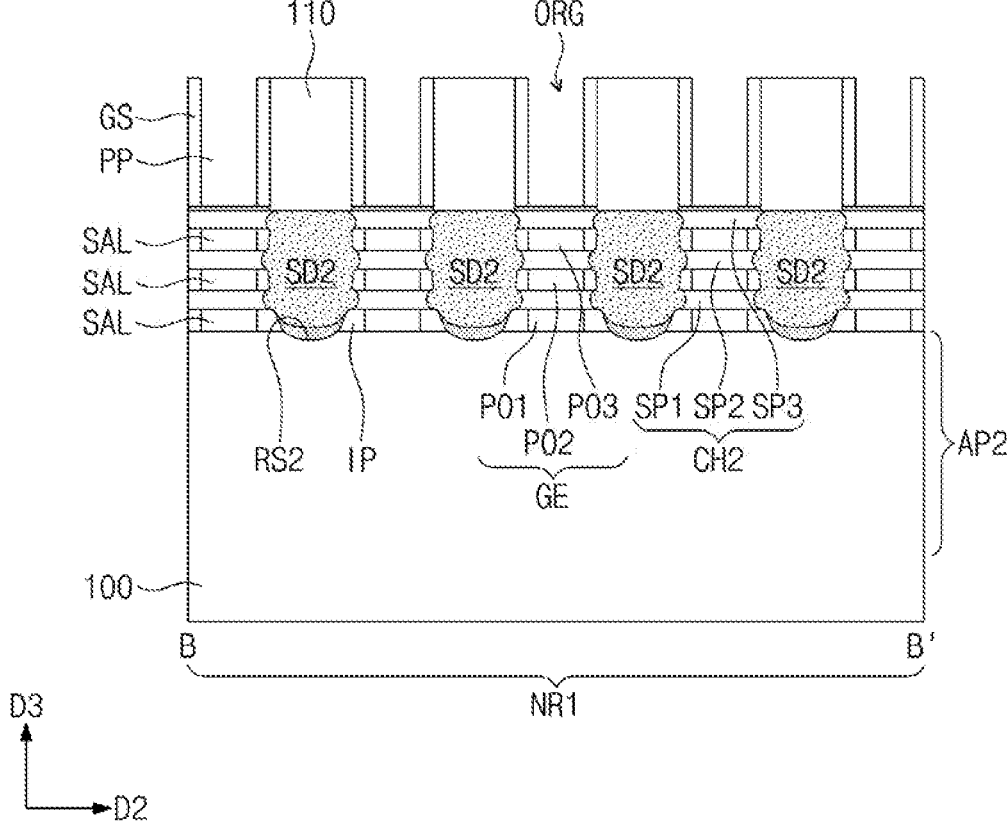
Figure 14C:
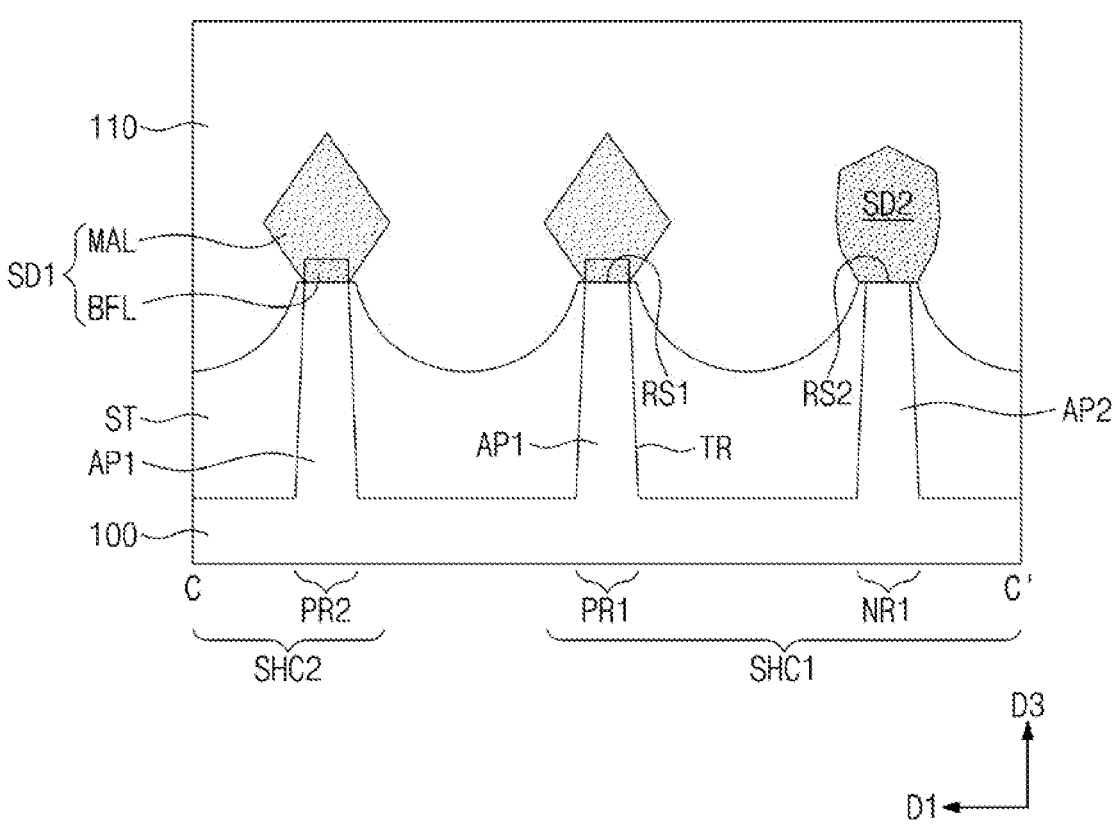
Figure 14D:
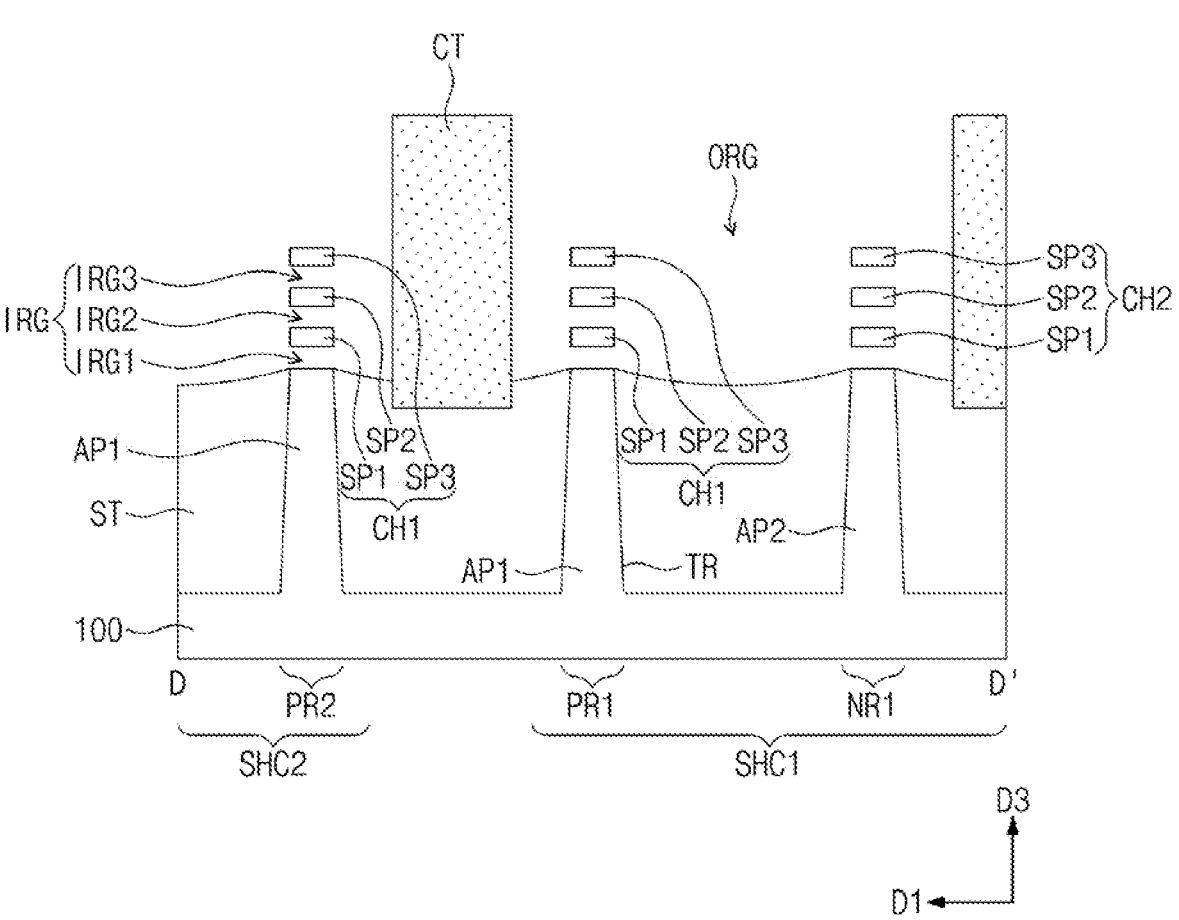
Figure 15A:
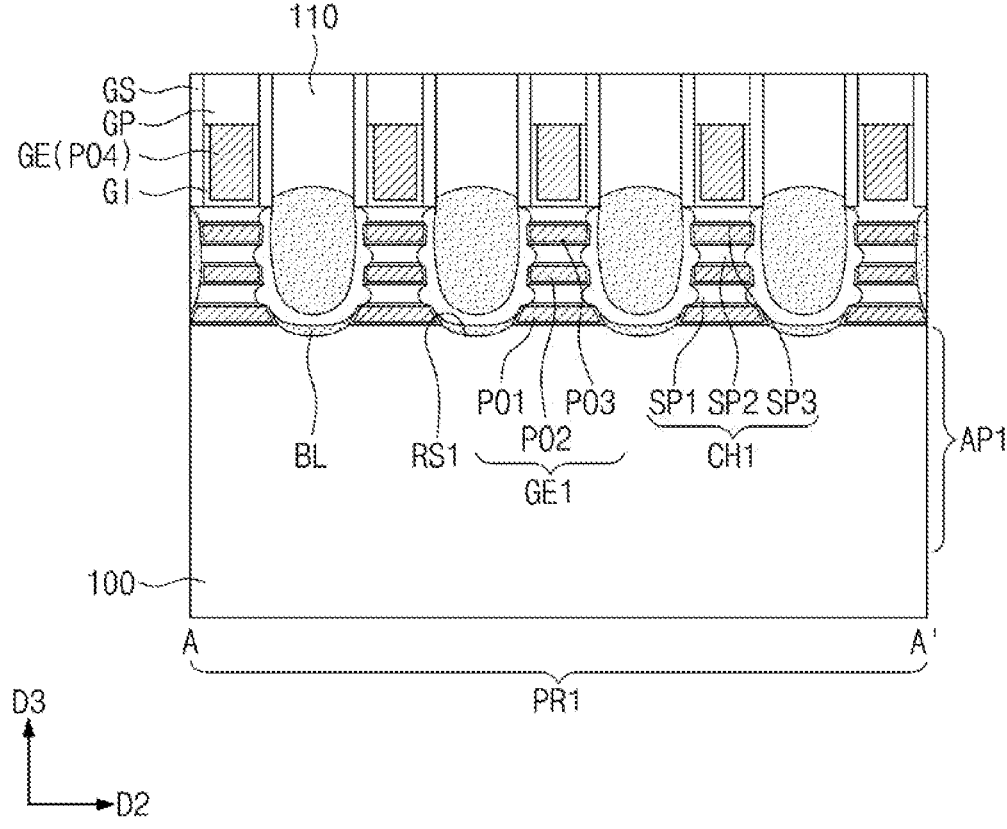
Figure 15B:
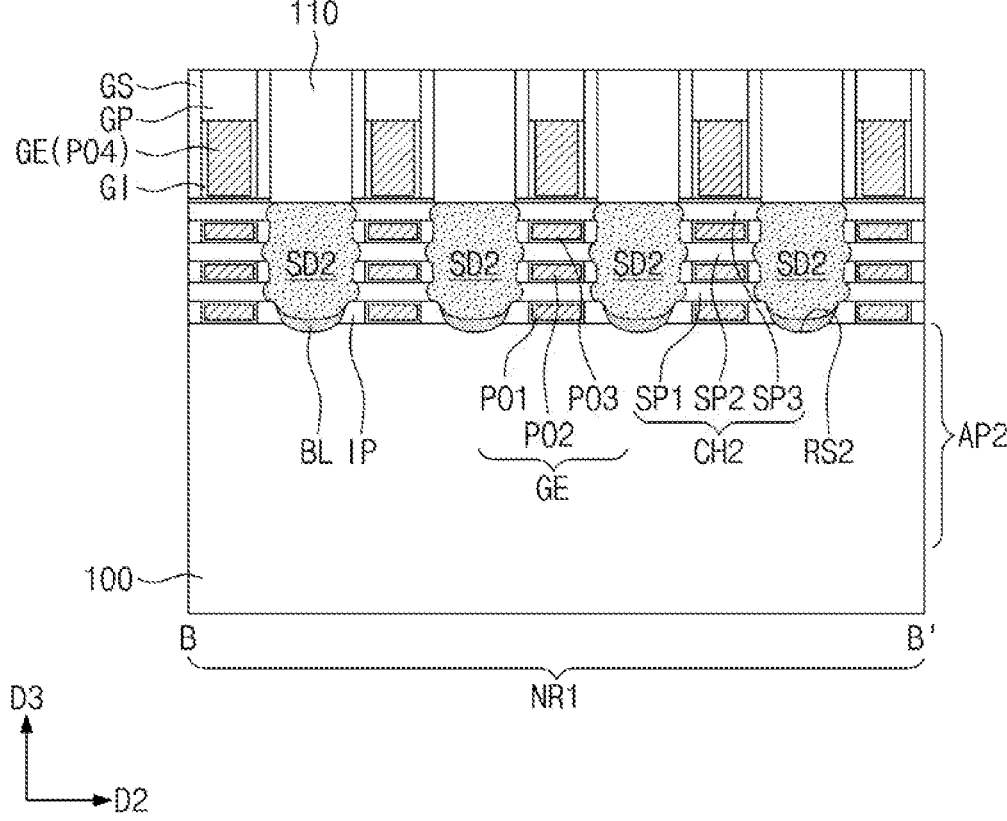
Figure 15C:
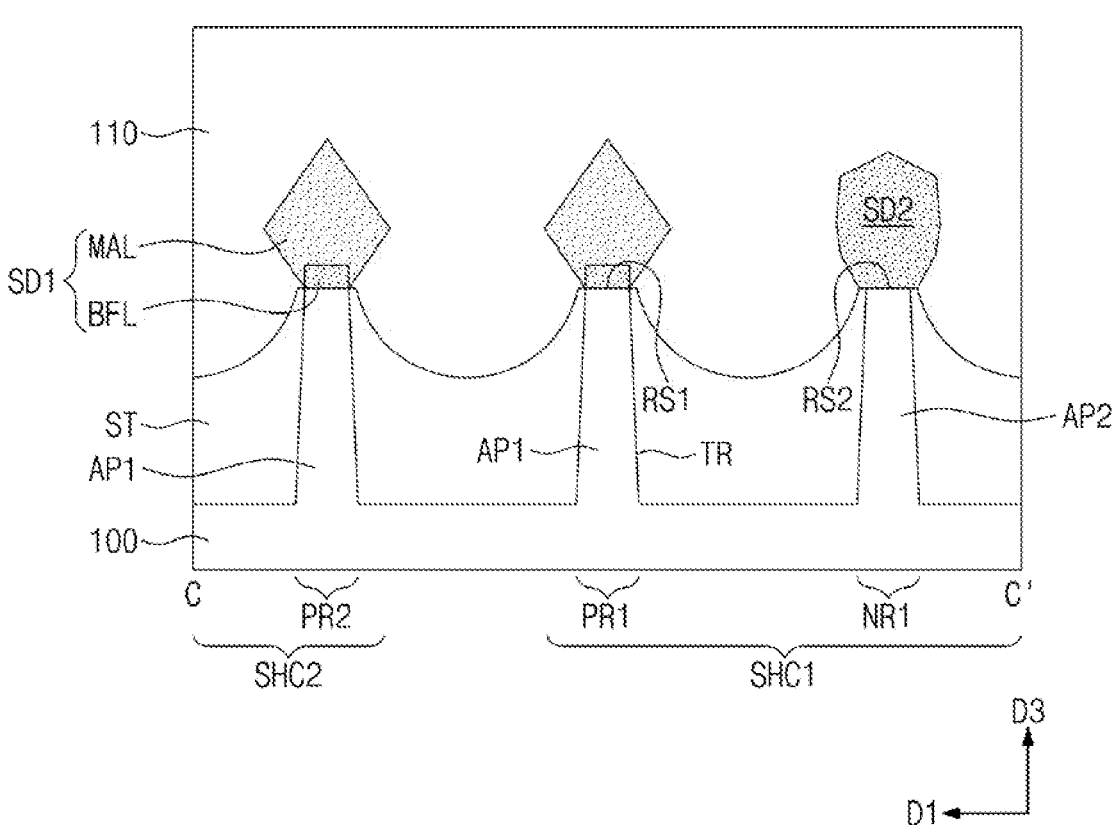
Figure 15D:
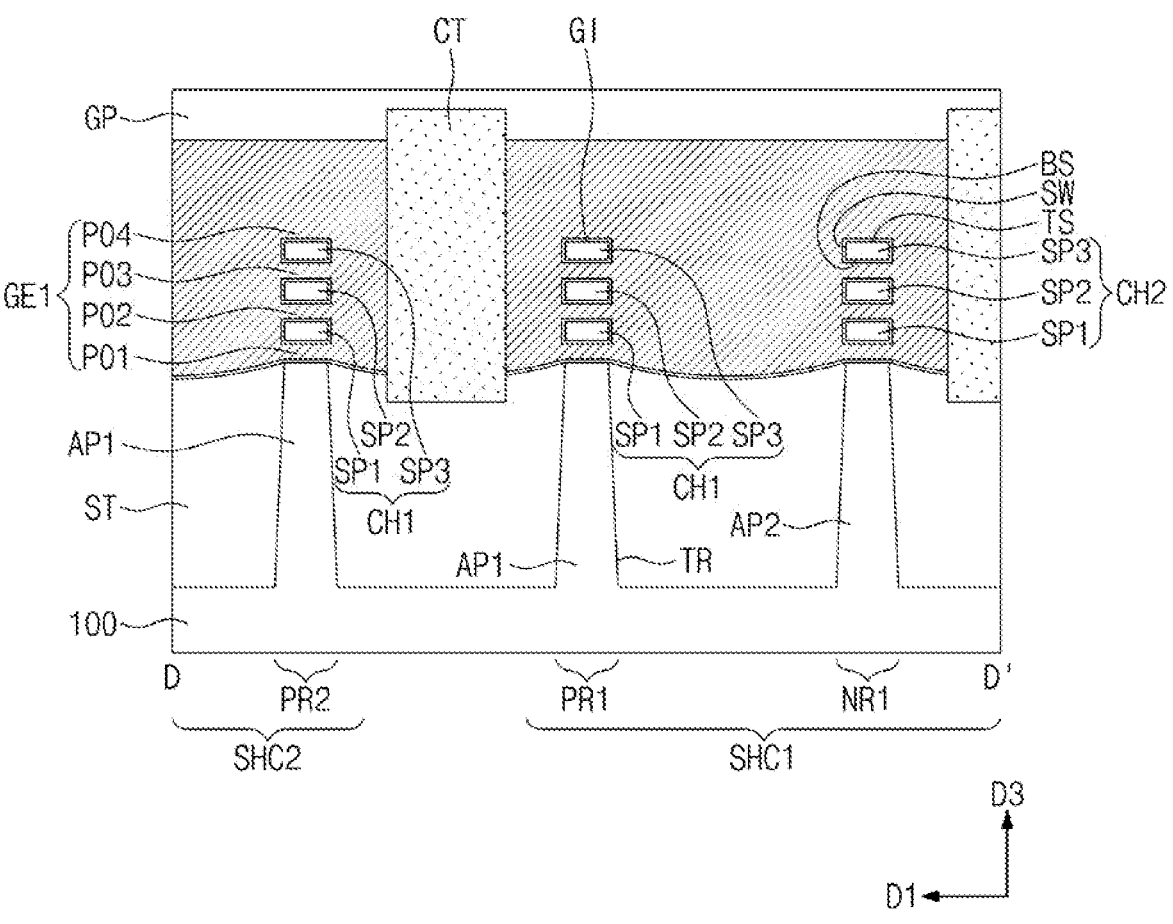

The sacrificial layers SAL exposed through the outer region ORG may be selectively removed to form inner regions IRG (e.g., see FIG. 14D). In an implementation, a process of selectively etching the sacrificial layers SAL may be performed to leave the first to third semiconductor patterns SP1, SP2, and SP3 and to remove only the sacrificial layers SAL. The etching process may be chosen to have a high etch rate for a material (e.g., SiGe) having a relatively high germanium concentration. In an implementation, the etching process may be chosen to have a high etch rate for a silicon germanium layer whose germanium concentration is higher than 10 at %.

The sacrificial layers SAL on the first and second PMOSFET regions PR1 and PR2 and the first and second NMOSFET regions NR1 and NR2 may be removed during the etching process. The etching process may be a wet etching process. An etchant material, which is used in the etching process, may be selected to quickly remove the sacrificial layer SAL having a relatively high germanium concentration. In an implementation, the first source/drain patterns SD1 on the first and second PMOSFET regions PR1 and PR2 may be protected from the etching process by the buffer layer BFL having a relatively low germanium concentration.

Referring back to FIG. 14D, the sacrificial layers SAL may be selectively removed, and only the first to third semiconductor patterns SP1, SP2, and SP3, which are stacked on each of the first and second active patterns AP1 and AP2, may be left. Hereinafter, empty regions, which are formed by removing the sacrificial layers SAL, will be referred to as first to third inner regions IRG1, IRG2, and IRG3, respectively.

In an implementation, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring to FIGS. 15A to 15D, the gate insulating layer GI may be conformally formed on the exposed first to third semiconductor patterns SP1, SP2, and SP3. The gate electrode GE may be formed on the gate insulating layer GI. The gate electrode GE may include the first to third portions PO1, PO2, and PO3, which are respectively formed in the first to third inner regions IRG1, IRG2, and IRG3, and the fourth portion PO4, which is formed in the outer region ORG.

The gate electrode GE may be recessed to have a reduced height. Upper portions of the gate cutting patterns CT may be slightly recessed, during the recessing of the gate electrode GE. The gate capping pattern GP may be formed on the recessed gate electrode GE.

Referring back to FIGS. 4 and 5A to 5D, the second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

The formation of each of the active and gate contacts AC and GC may include forming the barrier pattern BM and forming the conductive pattern FM on the barrier pattern BM. The barrier pattern BM may be conformally formed and may include a metal layer and/or a metal nitride layer. The conductive pattern FM may be formed of or include, e.g., a low resistance metal.

A pair of the division structures DB may be formed at both sides of each of the first and second single height cells SHC1 and SHC2. The division structure DB may penetrate the second interlayer insulating layer 120 and the gate electrode GE and may be extended into the active pattern AP1 or AP2. The division structure DB may be formed of or include an insulating material (e.g., silicon oxide or silicon nitride).

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

By way of summation and review, the scale-down of the MOS-FETs could lead to deterioration in operational properties of the semiconductor device. A variety of studies are being conducted to address technical limitations associated with the scale-down of the semiconductor device and to realize high-performance semiconductor devices.

According to an embodiment, a semiconductor device may include a source/drain pattern, which has a side surface protruding toward semiconductor patterns. In addition, a blocking layer may be between the source/drain pattern and an active pattern. Due to the intervening blocking layer, it may be possible to adjust a depth of the source/drain pattern. The blocking layer may help prevent the active pattern from being recessed in a recessing process for forming the protruding side surface. As a result, it may be possible to improve the electrical and reliability characteristics of the semiconductor device.

One or more embodiments may provide a semiconductor device including a field effect transistor.

One or more embodiments may provide a semiconductor device with improved reliability.

One or more embodiments may provide a method of fabricating a semiconductor device with improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate including an active pattern;
a channel pattern on the active pattern, the channel pattern including a plurality of semiconductor patterns, which are stacked to be spaced apart from each other;
a source/drain pattern connected to the plurality of semiconductor patterns;
a gate electrode on the plurality of semiconductor patterns; and
a blocking layer between the source/drain pattern and the active pattern,
wherein:
the source/drain pattern includes a protruding side surface protruding toward the plurality of semiconductor patterns,
the blocking layer includes silicon-germanium (SiGe), and
a germanium concentration of the blocking layer is higher than a germanium concentration of the source/drain pattern.

2. The semiconductor device as claimed in claim 1, wherein the germanium concentration of the blocking layer ranges from 5 at % to 10 at %.

3. The semiconductor device as claimed in claim 1, wherein a mean thickness of the blocking layer is smaller than a mean thickness of the plurality of semiconductor patterns.

4. The semiconductor device as claimed in claim 1, wherein the protruding side surface of the source/drain pattern has a rounded profile or an angular profile.

5. The semiconductor device as claimed in claim 1, further comprising an inner spacer, wherein:
the gate electrode includes an inner electrode between adjacent semiconductor patterns of the plurality of semiconductor patterns,
the inner spacer is between the inner electrode and the source/drain pattern, and
the blocking layer covers at least a portion of a side surface of the inner spacer.

6. The semiconductor device as claimed in claim 1, wherein a top surface of the blocking layer is in direct contact with a bottom surface of the source/drain pattern.

7. The semiconductor device as claimed in claim 1, wherein the plurality of semiconductor patterns include a concave side surface in contact with the source/drain pattern.

8. The semiconductor device as claimed in claim 1, further comprising a sacrificial layer, wherein:
the plurality of semiconductor patterns include a first semiconductor pattern at a highest level thereof, and
the sacrificial layer is on the first semiconductor pattern.

9. A semiconductor device, comprising:
a substrate including an active pattern;
a first channel pattern and a second channel pattern on the active pattern, the first channel pattern including a first nanosheet and the second channel pattern including a second nanosheet;
a source/drain pattern between the first channel pattern and the second channel pattern;
a first gate electrode on the first channel pattern and a second gate electrode on the second channel pattern; and
a blocking layer in contact with a bottom surface of the source/drain pattern,
wherein:
the first gate electrode includes a first inner electrode on the first nanosheet,
the second gate electrode includes a second inner electrode on the second nanosheet,
the source/drain pattern includes:
a first portion between the first nanosheet and the second nanosheet; and
a second portion between the first inner electrode and the second inner electrode,
the first portion has a first width and the second portion has a second width,
the first width is larger than the second width,
the blocking layer includes silicon-germanium (SiGe), and
a germanium concentration of the blocking layer is higher than a germanium concentration of the source/drain pattern.

10. The semiconductor device as claimed in claim 9, wherein a protruding side surface of the first portion protrudes toward the first nanosheet and the second nanosheet.

11. The semiconductor device as claimed in claim 9, further comprising an inner spacer between the first inner electrode and the source/drain pattern and between the second inner electrode and the source/drain pattern,
wherein the blocking layer covers at least a portion of a side surface of the inner spacer.

12. The semiconductor device as claimed in claim 9, wherein the germanium concentration of the blocking layer ranges from 5 at % to 10 at %.

13. The semiconductor device as claimed in claim 10, wherein the protruding side surface of the first portion has a rounded profile or an angular profile.

14. The semiconductor device as claimed in claim 9, wherein the first nanosheet and the second nanosheet each include a concave side surface.

15. The semiconductor device as claimed in claim 9, wherein a mean thickness of the blocking layer is smaller than a mean thickness of the first nanosheet and the second nanosheet.

16. A semiconductor device, comprising:

a substrate including an NMOSFET region;

an active pattern on the NMOSFET region;

a channel pattern and a source/drain pattern on the active pattern, the channel pattern including a plurality of semiconductor patterns, which are stacked to be spaced apart from each other;

a blocking layer between the source/drain pattern and the active pattern;

a gate electrode on the channel pattern, the gate electrode including an inner electrode between adjacent semiconductor patterns of the plurality of semiconductor patterns;

a gate insulating layer between the gate electrode and the channel pattern;

an inner spacer between the inner electrode and the source/drain pattern;

a gate spacer on a side surface of the gate electrode;

a gate capping pattern on a top surface of the gate electrode;

a gate cutting pattern penetrating the gate electrode;

an interlayer insulating layer on the gate capping pattern and the gate cutting pattern;

an active contact penetrating the interlayer insulating layer and being electrically connected to the source/drain pattern;

a metal-semiconductor compound layer between the active contact and the source/drain pattern;

a gate contact penetrating the interlayer insulating layer and the gate capping pattern and being electrically connected to the gate electrode; and a first metal layer on the interlayer insulating layer, wherein:

the first metal layer includes:

a power line, which is vertically overlapped with the gate cutting pattern, and first interconnection lines, which are electrically and respectively connected to the active contact and the gate contact, the blocking layer includes silicon-germanium (SiGe), and the blocking layer covers at least a portion of a side surface of the inner spacer.

17. The semiconductor device as claimed in claim 16, wherein a germanium concentration of the blocking layer ranges from 5 at % to 10 at %.

18. The semiconductor device as claimed in claim 16, wherein the source/drain pattern includes a protruding side surface protruding toward the plurality of semiconductor patterns.

19. The semiconductor device as claimed in claim 18, wherein the protruding side surface has a rounded profile or an angular profile.

20. The semiconductor device as claimed in claim 16, wherein a top surface of the blocking layer is in direct contact with a bottom surface of the source/drain pattern.

* * * * *